US008699262B2

(12) United States Patent
Watanabe et al.

(10) Patent No.: US 8,699,262 B2
(45) Date of Patent: Apr. 15, 2014

(54) SEMICONDUCTOR MEMORY DEVICE

(75) Inventors: Takao Watanabe, Fuchu (JP); Satoru Hanzawa, Hachioji (JP); Yoshitaka Sasago, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 344 days.

(21) Appl. No.: 13/270,299

(22) Filed: Oct. 11, 2011

(65) Prior Publication Data

US 2012/0087178 A1    Apr. 12, 2012

(30) Foreign Application Priority Data

Oct. 12, 2010    (JP) .................................. 2010-229219

(51) Int. Cl.
*G11C 11/24*    (2006.01)

(52) U.S. Cl.
USPC .......................... 365/149; 365/63; 365/185.05

(58) Field of Classification Search
USPC ....................................... 365/149, 63, 185.05
See application file for complete search history.

(56) References Cited

U.S. PATENT DOCUMENTS 6,031,779 A *    2/2000    Takahashi et al. ............. 365/226
7,310,256 B2 *   12/2007    Takemura et al. ............... 365/63
2003/0035324 A1 *  2/2003  Fujita et al. ............... 365/189.07
2006/0197115 A1    9/2006   Toda
2006/0203541 A1    9/2006   Toda
2008/0137401 A1    6/2008   Philipp et al.
2009/0244953 A1   10/2009   Maejima
2010/0182853 A1 *  7/2010   Ohsawa ................. 365/189.011
2012/0113707 A1 *  5/2012   Takemura ...................... 365/149

FOREIGN PATENT DOCUMENTS

| JP | 2006-514392 A | 4/2006 |
| JP | 2006-514440 A | 4/2006 |
| JP | 2008-165964 A | 7/2008 |
| JP | 2009-217908 A | 9/2009 |

OTHER PUBLICATIONS

Yoshiaki Fukuzumi et al. "Optimal Integration and Characteristics of Vertical Array Devices for Ultra-High Density, Bit-Cost Scalable Flash Memory", IEEE International Electron Devices Meeting, 2007, pp. 449-452.

* cited by examiner

*Primary Examiner* — Tuan T. Nguyen
(74) *Attorney, Agent, or Firm* — Miles & Stockbridge P.C.

(57) ABSTRACT

Adverse effects of a parasitic resistance and a parasitic capacitance of a driver circuit to a memory cell causes problems of thermal disturbance to a not-selected cell, unevenness of application voltage, degradation of a memory element in reading. A capacitor (C) is provided above or beneath a memory cell (MC) that includes a memory element to which a current write memory information and a selection element connected to the memory element. A charge stored in this capacitor writes to the memory element.

10 Claims, 15 Drawing Sheets

SEMICONDUCTOR MEMORY DEVICE

CLAIM OF PRIORITY

The present application claims priority from Japanese patent application JP 2010-229219 filed on Oct. 12, 2010, the content of which is hereby incorporated by reference into this application.

BACKGROUND OF THE INVENTION

1. Field of the Invention

The present invention relates to a semiconductor memory device.

2. Background Art

Research and development have been conducted pertaining to a semiconductor memory device in which memory cells including variable resistance elements are arranged in an array.

For instance, a PCRAM (Phase-Change Random Access Memory, or phase-change memory) utilizing chalcogenide elements as variable resistance elements has been known.

In the PCRAM, the temperature of a chalcogenide element configuring a memory cell is controlled by changing current/voltage to be applied to a selected memory cell, and information is recorded (written) by phase-changing the chalcogenide element to a crystalline state or a noncrystalline state. The resistance value of the chalcogenide element in the amorphous state is higher than that in the crystalline state. Accordingly, the resistance value of the chalcogenide element configuring the memory cell is detected by a circuit, thereby allowing reading of written information.

As another semiconductor memory device using a variable resistance element, a ReRAM (Resistance Random Access Memory) using a transition metal oxide element, and a CBRAM (Conductive Bridging Random Access Memory) that changes the resistance by precipitating metal cations to form a bridge (conducting bridge) between electrodes and ionizing the precipitated metal to destruct the bridge have been known (see JP Patent Publication (Kokai) No. 2009-217908A (2009)).

These semiconductor memory devices are capable of maintaining stored information in nonvolatile manner even after breaking of power source. A writing operation that changes a variable resistance element in a memory cell from a high resistance state to a low resistance state is referred to as "set"; the operation that changes the element from the low resistance state to the high resistance state is referred to as "reset". Some proposals have been made on circuits for setting or resetting.

JP Patent Publication (Kokai) No. 2009-217908A (2009) aims at preventing failed data write or failed data erase from occurring in setting or resetting operation on a memory cell by means of including a current limit circuit that limits the value of current flowing in the memory cell in writing data to a prescribed current limit value. JP Patent Publication (Kohyo) Nos. 2006-514392A (2006) and 2006-514440A (2006) aim at securing a read/write margin even if unevenness in distribution of low and high resistance values of memory cells becomes large, by means of including a write circuit that selects two neighboring memory cells in a cell array in a 3D phase-change memory as a pair cell and writes to cause one and the other of the pair cell to be high and low resistance value states, respectively, and read circuit that reads the complementary resistance value states of the pair cell as one-bit data. JP Patent Publication (Kokai) No. 2008-165964A (2008) aims at limiting a peak power consumption in writing on a phase-change memory by means of receiving a first current to program a plurality of resistance memory cells, limiting this current, and supplying a pulse generator with stored charge as a second current.

A related technical document, IEEE International Electron Devices Meeting, 2007, pp. 449-452, "Optimal Integration and Characteristics of Vertical Array Devices for Ultra-High Density, Bit-Cost Scalable Flash Memory", discloses a multilayer flash memory technology and describes an idea allowing the planar density of memory cells to be 4 $F^2$.

Problems to be solved by the present invention are important in semiconductor memory devices using variable resistance elements for allowing memory cells to be finer and highly integrated, that is, improving scaling. More specifically, three problems will be described later. These problems are not considered in the above cited documents, which do not discuss effects of parasitic resistance and parasitic capacitance from a driver circuit to a memory cell. Hereinafter, for the sake of simplicity, the memory cell and the memory cell array are simply referred to as a cell and an array, respectively, in some cases.

A first problem is that heat generated in a selected cell is conducted to a not-selected cell and this varies and degrades the resistance value of a variable resistance element in the not-selected cell. The separation between cells is reduced with improvement in scaling. As a result, Joule heat is generated by application of a current to the selected cell in setting or resetting to neighboring not-selected cells. Accordingly, it is concerned that the states of the variable resistance elements in the neighboring cells are partially changed and, at worst, large variation in resistance value reverses stored information. This specification refers to this phenomenon as thermal disturbance to a non-selected memory cell.

A second problem is a loss and unevenness of write voltage. Improvement in scaling makes wiring from a write circuit to a memory cell array finer, thereby increasing the resistance value. Accordingly, in a writing operation, when a voltage is applied from the write circuit to a selected cell in the array, the voltage is dropped owing to the wiring resistance and thus the voltage to be applied to the cell becomes lower than that generated in the write circuit. The distance between the write circuit and the selected cell is different according to the position of the cell on a semiconductor chip, thereby increasing unevenness of voltage drop accordingly.

As a result of the voltage drop not only reduces the current flowing to the cell but also varies the amount thereof. Thus, the write current to the cell varies according to the position on the chip, and stable operation becomes difficult.

A third problem is reduction in read speed. As described above, a reading operation of the semiconductor memory device using the variable resistance element requires detecting the magnitude of the resistance of the variable resistance element in the cell. For the sake thereof, the magnitude of current flowing by application of a voltage to the variable resistance element in the selected cell is typically detected.

However, application of a voltage and a current close to those required for writing causes a fear that changes or reverses the state of the variable resistance element in the cell. Accordingly, in order not to rewrite the state of the variable resistance element, the voltage and the current for reading is preferably smaller than those to be applied in writing. As a result, it becomes difficult to speed up transmission of a read signal of the memory cell from the array to a read circuit. For instance, the speed of driving a wiring, referred to as a bit line, by a current flowing to a memory cell is limited by the current capable of flowing to the memory cell and the parasitic capacitance of the bit line. In a case where improvement in scaling reduces the distance between the memory cells, the pitch of the bit lines becomes narrower. This increases the parasitic capacitance of the bit line, thereby reducing the read speed.

The problems, which become serious with improvement in scaling in a semiconductor memory device using a variable resistance element, are not well considered in the reference documents.

SUMMARY OF THE INVENTION

A semiconductor memory device includes: a first selection line provided on a semiconductor substrate; a second selection line that is provided above the first selection line and extends in a direction intersecting with the first selection line; a first memory cell that is provided between the first and second selection lines and includes a first memory element to which a current writes memory information and a first selection element connected to the first memory element; a capacitor provided above or beneath the first memory cell; and a driver circuit that stores a charge in the capacitor, wherein the charge stored in the capacitor writes in the first memory element.

Simple description of a typical one of advantageous effects of the present invention is as follows. A highly reliable semiconductor memory device in which effects of parasitic resistance and parasitic capacitance are reduced can be provided.

DETAILED DESCRIPTION OF THE PREFERRED EMBODIMENTS

In the following description, for the sake of easy understanding, names of power sources and signal input terminals may adopt the same names of power sources and signals to be applied to the terminals. That is, the name of a power source input terminal to which a power source voltage Vx is input may be represented as Vx. The name of a signal input terminal to which a signal $\phi x$ is input may be represented as $\phi x$.

Figure 1:
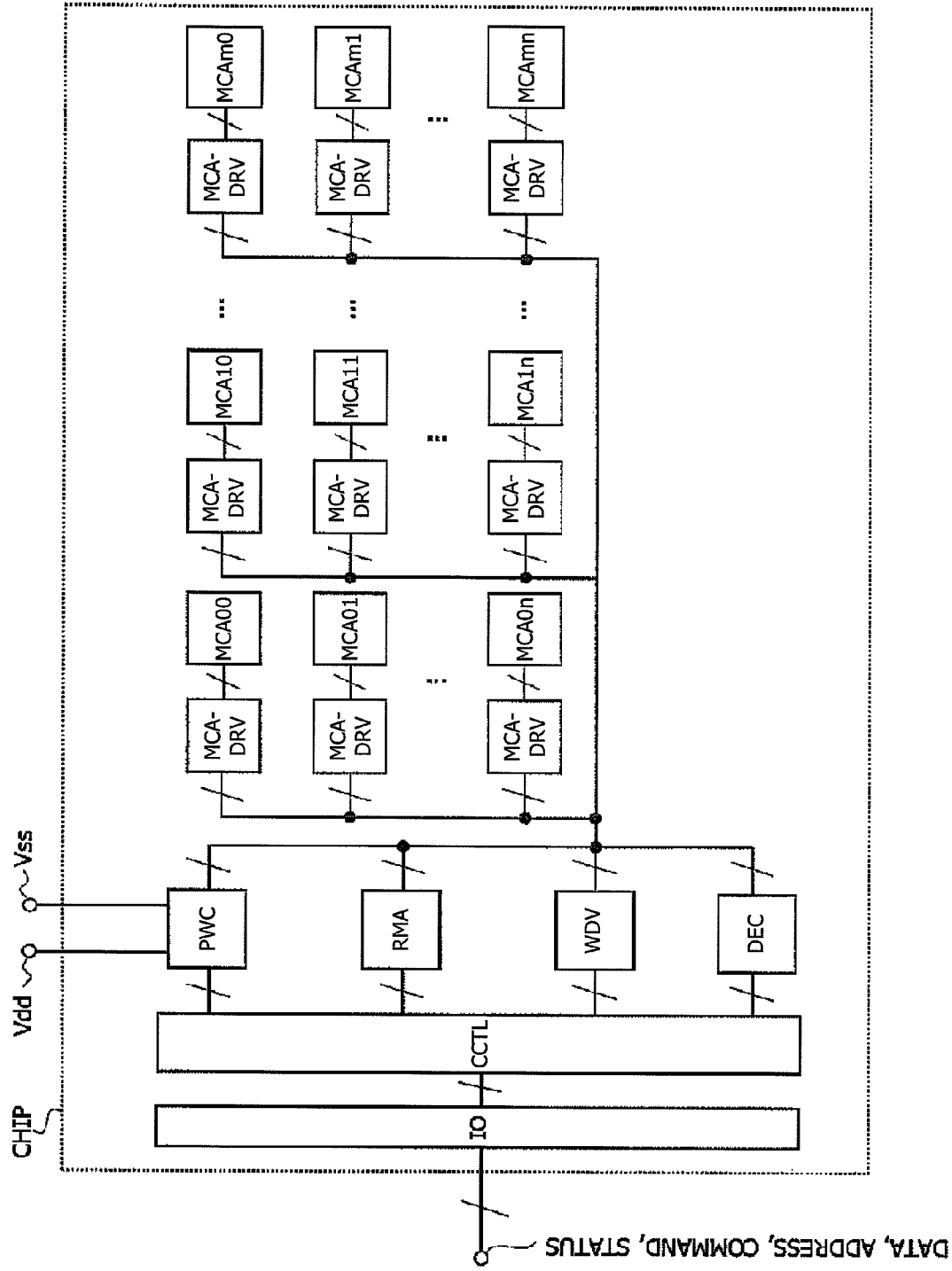
FIG. 1 shows an embodiment illustrating a configuration of a semiconductor memory device according to the present invention.

FIG. 1 shows an embodiment illustrating a configuration of a semiconductor memory device according to the present invention. In this embodiment, memory cell subarrays MCA00-MCAmn, in which memory cells for storing information in a nonvolatile manner are arranged in an m×n matrix, and peripheral circuits for controlling the memory cell subarrays are integrated on a semiconductor chip CHIP.

Hereinafter, for the sake of simplicity, the memory cell subarray may simply be referred to as a subarray. The memory cell in the subarray includes a variable resistance element, such as a chalcogenide element, as will be described later.

Functions of respective blocks in FIG. 1 will be described. A data input/output circuit IO receives commands, addresses, data for setting and resetting and the like from an external host apparatus, not shown, and returns the read data and status signals to the external host apparatus.

The circuit IO transmits the commands, data, addresses and the like to a chip control circuit CCTL. The chip control circuit CCTL receives the commands, data, addresses and the like transmitted from the data input/output circuit IO, and, on the basis thereof, supplies required signals to the other peripheral circuits, such as a power source circuit PWC, a read main amplifier RMA, a write data driver WDV, a decoder DEC, and a subarray driver circuit MCA-DRV, in the chip CHIP, selects a memory cell in the subarrays MCA00-MCAmn by its address, and performs a reading operation of reading data stored in the selected memory cell and setting and resetting operations of writing information in the selected memory cell. As necessary, the circuit CCTL outputs a status signal, which represents a state of a peripheral circuit or a state of an operation sequence, to an external host via the data input/output circuit IO.

The power source circuit PWC generates a voltage required to operate the chip CHIP based on a voltage supplied to the chip CHIP from the outside, and supplies the generated voltage to peripheral circuits in the chip or the subarrays MCA00-MCAmn via a power source supply line, not shown. This diagram shows two external power source input terminals Vdd and Vss, to which a high voltage Vdd and a low voltage Vss are applied, respectively. It is a matter of course that a more number of external power source input terminals can be used, as necessary.

The read main amplifier RMA amplifies and shapes a signal read from the memory cell by the subarray driver circuit MCA-DRV and transmitted via a read preamplifier RPA, which is in the subarray driver circuit but not shown, and transmits the signal to the data input/output circuit IO via the chip control circuit CCTL.

The write data driver WDV receives data for setting or resetting from the data input/output circuit IO via the chip control circuit CCTL, amplifies and shapes the data, and transmits the data to the subarray driver circuit MCA-DRV.

The decoder DEC receives an address signal from the data input/output circuit IO via the chip control circuit CCTL, decodes the signal, activates the subarray driver circuit MCA-DRV in the subarray to which the cell to be selected belongs, and transmits an address signal for selecting the cell in the subarray to a sub-decoder in the subarray driver circuit MCA-DRV.

The subarray driver circuits MCA-DRV are provided for the respective subarrays MCA00-MCAmn, and select a cell in the subarray and perform a reading operation and setting and resetting operations on the selected cell. Here, the description will be made assuming an operation that selects a plurality of subarrays and selects one cell from one subarray in reading, setting and resetting. However, the present invention is not limited thereto.

As will be described later, the subarray driver circuits MCA-DRV are formed utilizing regions immediately above or beneath or adjacent to sides of the respective subarrays driven by the circuits concerned. This allows the area of the semiconductor chip configuring the semiconductor memory device to be maintained small. A multiplicity of semiconductor chips are formed on a semiconductor wafer at one time, as is generally known. Accordingly, the smaller the area of one semiconductor chip, the more the number of chips to be acquired from one wafer increases. This enables the chip to be manufactured at a low unit cost. Hereinafter, the description will be made exemplifying an embodiment with a focus on configurations and operations of the circuit and the subarray; methods of solving the problems will be clarified through the description.

There is a reason to believe that a designer of semiconductor memory devices can design the configurations and operations of the peripheral circuits other than the subarray driver circuit MCA-DRV without illustration of the detailed circuit configurations. Accordingly, the detailed description thereof is omitted. Typical circuits, such as a sub-decoder and a driver circuit may be omitted from the drawings and the description as appropriate, even though the circuits are included in the subarray driver circuit MCA-DRV.

The block diagram of FIG. 1 shows one embodiment of the present invention. The present invention is not limited thereto. It is a matter of course that the present invention is applicable to various modifications in which, for instance, another chip configuration having three layers for decoding addresses instead of two is adopted.

Figure 2:
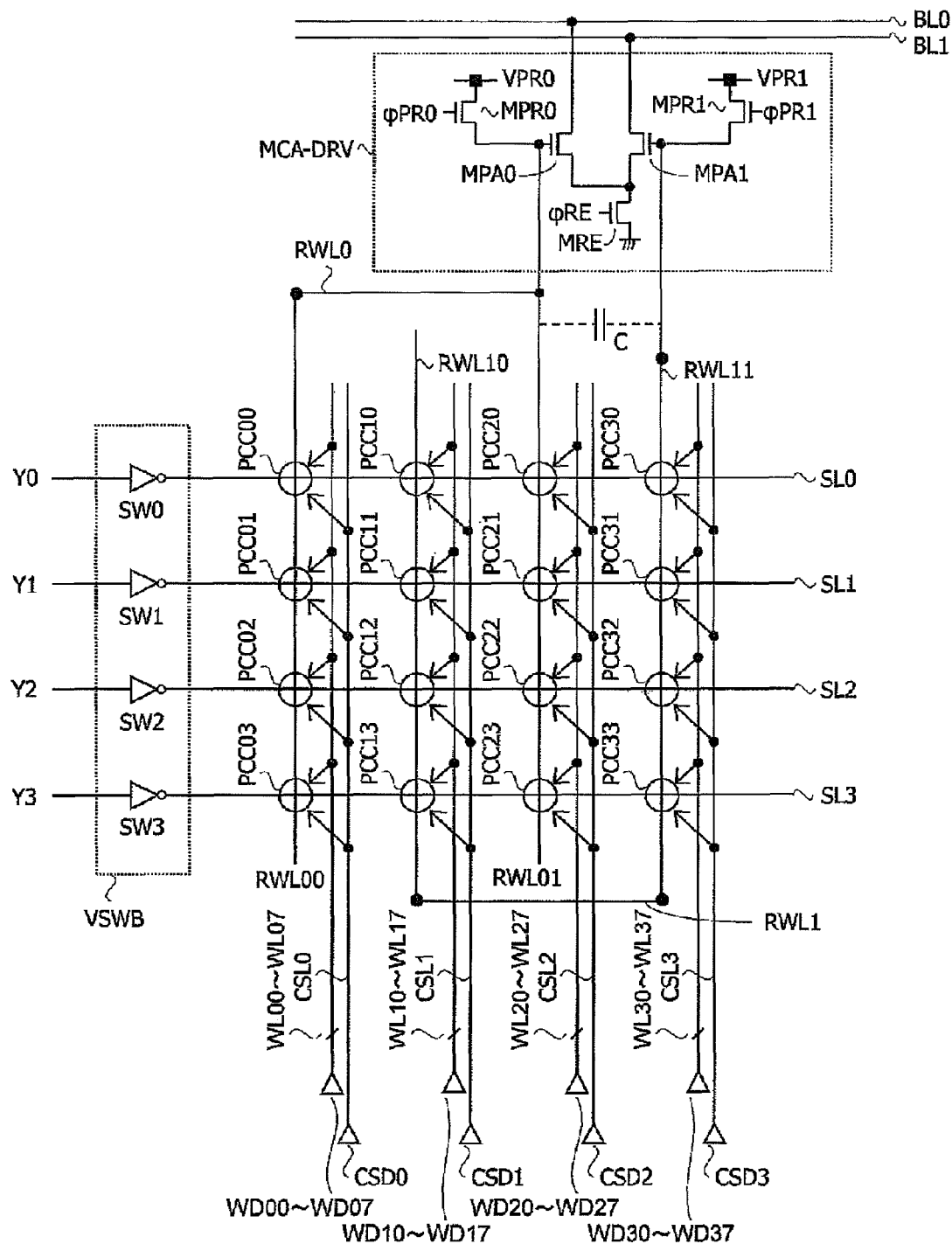
FIG. 2 is a diagram showing a circuit configuration of the embodiment of subarrays and subarray driver circuits viewed in the XY plane.
Figure 3:
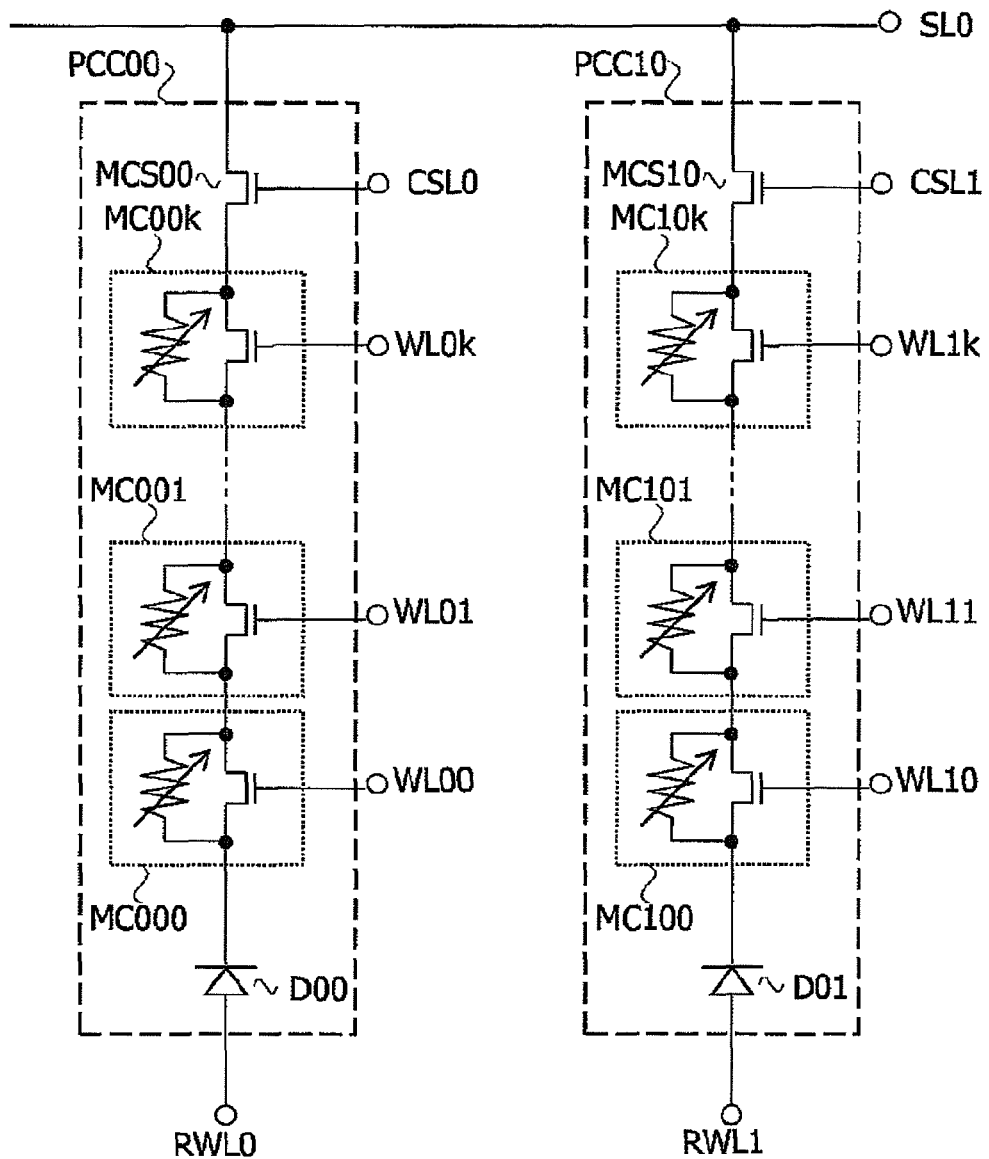
FIG. 3 is a diagram showing the embodiment in FIG. 2 viewed in the YZ plane.
Figure 4:
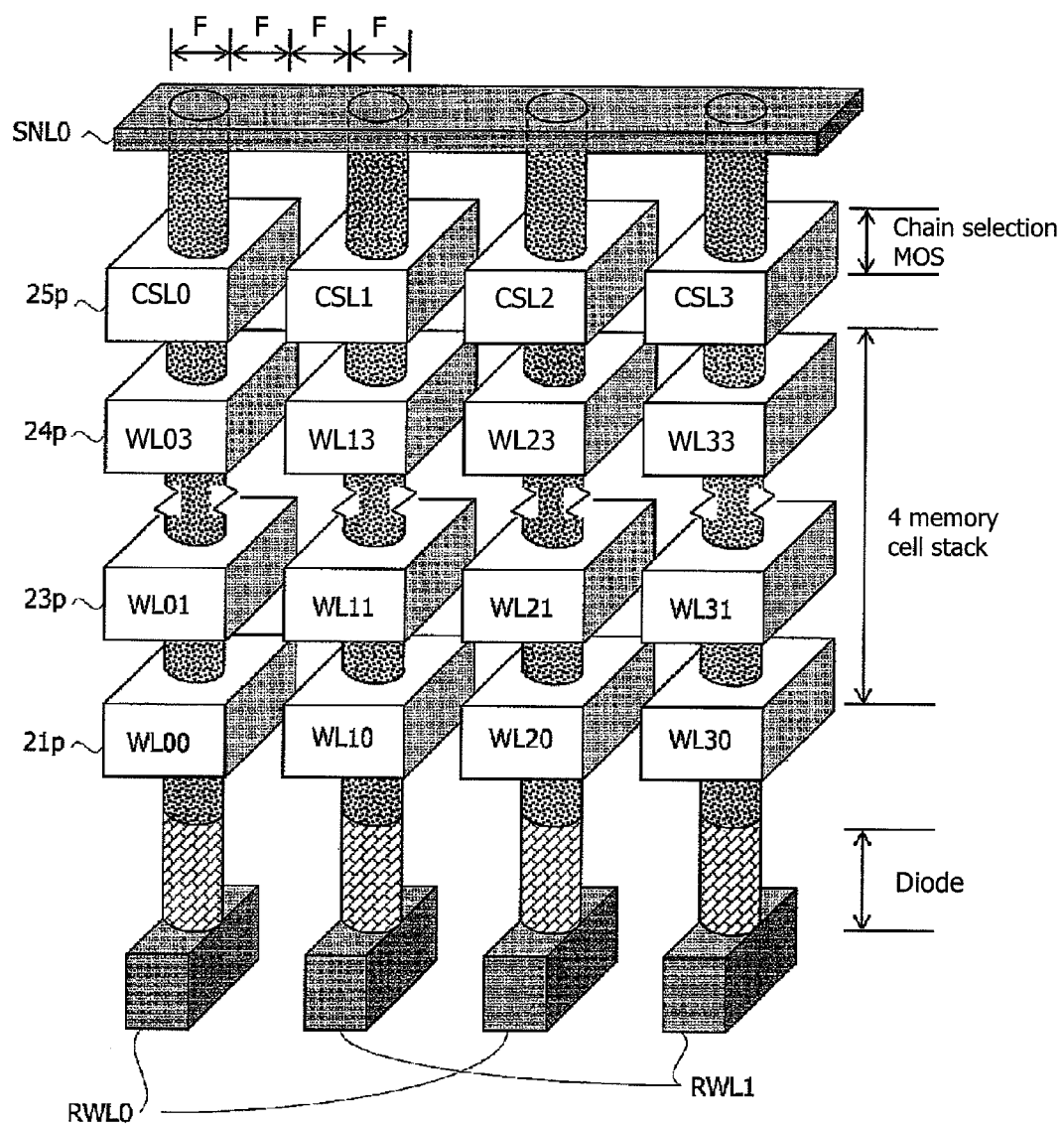
FIG. 4 is a diagram showing the embodiment in FIG. 2 as a perspective view.
Figure 5:
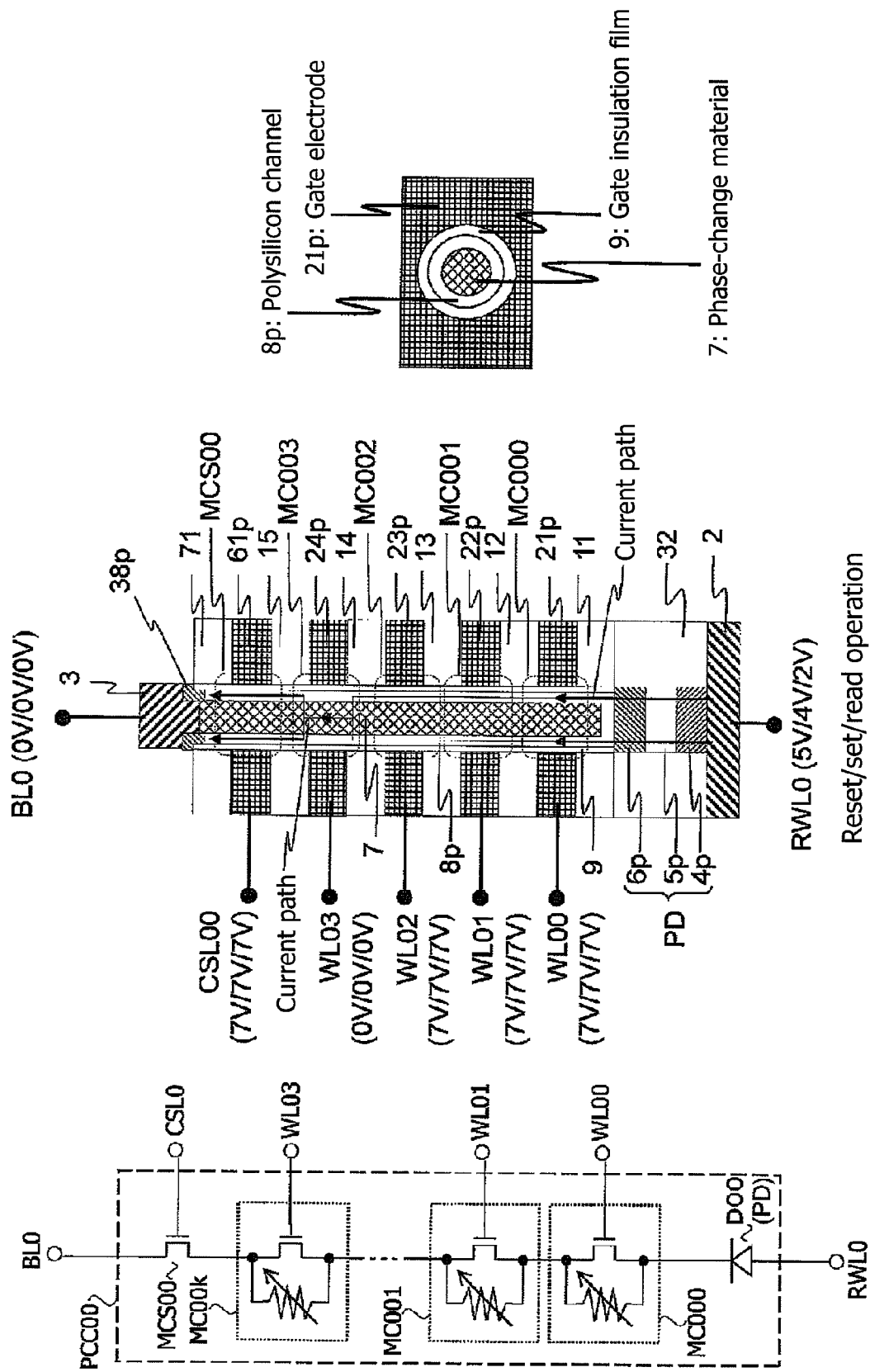
FIG. 5 shows an embodiment of a structure of chain cells suitable for the embodiments in FIGS. 2 to 4.
Figure 6:
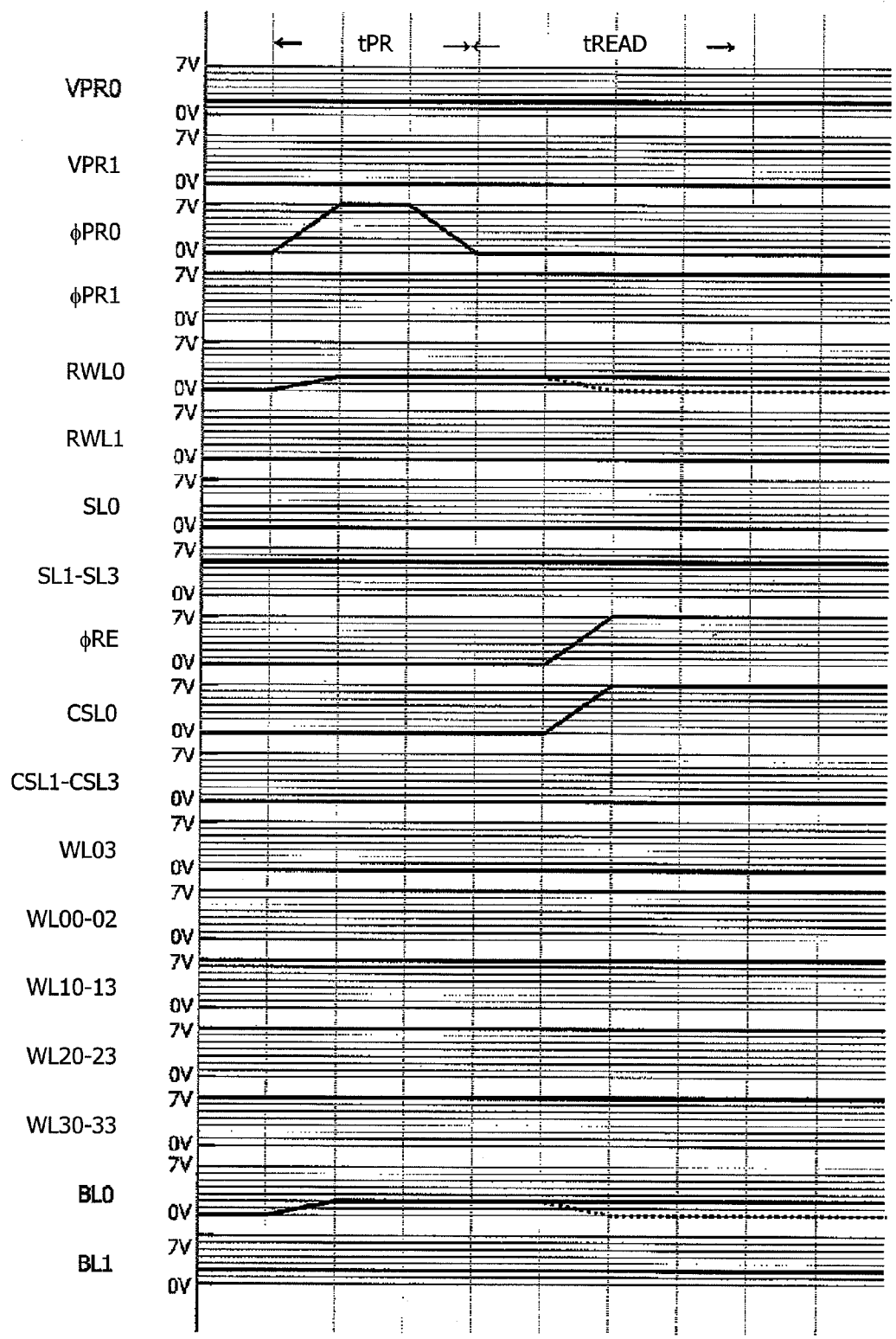
FIG. 6 shows an embodiment illustrating a timing chart in reading.
Figure 7:
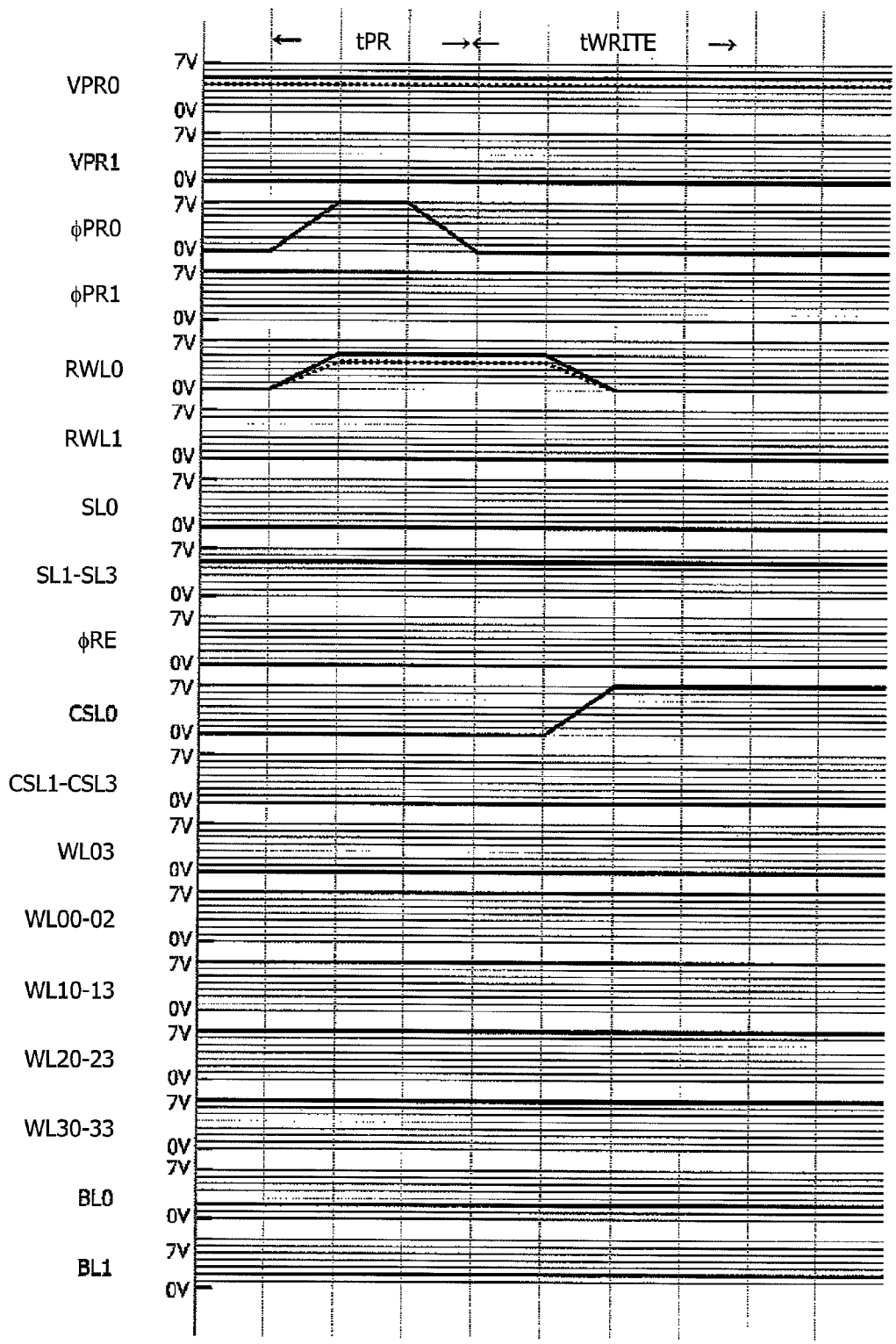
FIG. 7 shows an embodiment illustrating a timing chart in setting and resetting.

Referring to FIGS. 2 to 6, one embodiment of the subarray driver circuits and the subarrays will hereinafter be described. FIGS. 2 to 4 show a three-dimensional configuration of the subarrays and main parts of the subarray driver circuits. FIG. 5 shows the embodiment illustrating the configuration of the chain cell. FIGS. 6 and 7 show the embodiment of timing charts of reading, setting and resetting suitable for the embodiment of FIGS. 2 to 5.

Hereinafter, this specification defines a surface of the semiconductor chip on which the subarrays and the circuits are formed as an XY plane, and also defines the direction perpendicular to the plane as a Z direction. In the XY plane, the direction in which an after-mentioned sync line extends is defined as an X direction and the direction perpendicular to the X direction is defined as a Y direction. For instance, an after-mentioned embodiment exemplifies an example where a polysilicon gate of a MOS transistor in a subarray, which is referred to as a word line, extends in the Y direction and is separated in the X and Z directions.

According to the definitions, FIG. 2 shows the configuration of the XY plane, FIG. 3 shows the configuration of the XZ plane, and FIG. 4 shows a perspective view thereof. For the sake of easy understanding, configurational elements are partially omitted in some diagrams and relative dimensions are changed.

Referring to FIGS. 2 to 4, a fundamental configuration and a principle of this embodiment will be described. First, chain cells including memory cells will be described. The chain cells are three-dimensional cells including a plurality of memory cells stacked in the Z direction. In FIG. 2 viewed in the XY directions, reference symbols PCC00-PCC30, PCC01-PCC31, PCC02-PCC32 and PCC03-PCC33, which are represented by circles, denote the chain cells. In a representation where subscripts of PCC are ij, i indicates an X coordinate and j indicates a Y coordinate. In FIG. 2, the description is made using an example of a subarray in which four rows and four columns, total 16, of chain cells are arranged in a matrix manner. However, the present invention does not limit the number of chain cells configuring the subarray. Instead, it is a matter of course that a subarray with a larger scale, for instance, 128 rows and 128 columns or 512 rows and 512 columns and a subarray with the different numbers of rows and columns, such as 256 rows and 512 columns are applicable as necessary.

FIG. 3 shows the configuration of the chain cells viewed in the XZ directions. FIG. 4 shows a perspective view of the subarrays. FIG. 3 only shows two sets of chain cells PCC00 and PCC01 adjacent to each other in the X direction. In this embodiment, chain selection MOS transistors MCS00 and MCS01 are provided at the top of the respective sets of chain cells; respective sets of memory cells MC000-MC003 and MC010-MC013 are stacked therebelow. Diodes D00 and D01 are connected to the respective bottoms. The orientation of the diode is such that the bottom is the anode in order to allow a forward current to flow from the bottom to the top.

The description will be made using the embodiment with the number of cells configuring a set of chain cells (hereinafter, referred to as the chain length) is four. However, the present invention is not limited thereto. The chain length may be longer within an extent where the equivalent resistance value of the chain cells does not reaches what causes a problem in operation speed; the length may be shorter, as necessary.

In the embodiment of this specification, the description is made using the embodiment adopting one stage of chain cell array. A plurality of chain cell arrays can be stacked above the chain cell array. Accordingly, the chain length may be limited by the equivalent resistance value of the chain cells and the like within an extent where the speed is not adversely affected, and the subarray may be configured by stacking several stages of chain cell arrays. This allows high speed and integration in a compatible manner.

The chain cells PCC00 and PCC10 are connected to a sync line SL0 at the top, and to respective read/write lines RWL0 and RWL1 at the bottoms. As shown in FIG. 3, in the individual memory cell configuring the chain, the MOS transistor and the variable resistance element are connected to each other in parallel. Here, the description is made on the embodiment adopting phase-change material as the variable resistance element. However, it is a matter of course that the present invention is applicable to a cell adopting another variable resistance element, having been described.

Bit information of the cell '1' or '0' are defined according to whether the phase-change material is crystalline (low resistance) or amorphous (high resistance). A writing operation that changes the amorphous state to the crystalline state, that is, reduces the resistance value of the variable resistance element is referred to as set. A writing operation that changes the crystalline state to the amorphous state, that is, increases the resistance value of the variable resistance element is referred to as reset.

In the chain cell, provided that the chain selection MOS transistor is in an on state, the MOS transistor of the selected cell is in an off state and the MOS transistors of the other cells are the on state, when a current flows to the chain, the current flows through the variable resistance element in the selected cell and flows through the MOS transistor in the not-selected cell. Use of this allows the current to flow from the cells among the chain cells to the variable resistance element in a specified cell. The phase change is thus caused in the selected variable resistance element, thereby allowing setting and resetting operations to be performed. In the reading operation, current and voltage in an extent that does not cause the phase change in the variable resistance element are applied, and information of the selected cell is discriminated according to the flowing current.

Next, the wiring layer shown in FIGS. 2 to 4 will be described. Reference symbols RWL0 and RWL1 denote read/write lines. Reference symbols BL0 and BL1 denote read bit lines. Reference symbols SL0-SL3 denote sync lines. The read/write lines RWL0 and RWL1 are electrodes formed on the wiring layer, and thus formed immediately beneath the cell array. As understood in FIGS. 2 to 4, the read/write line alternately shorts wirings that extend in the Y direction and are arranged according to a pitch of the chain cell. Accordingly, the read/write lines RWL0 and RWL1 can form an interdigitated capacitance via an insulation film filled between the wiring layers. A capacitor C shown by a broken line in FIG. 2 represents this capacitance. More specifically, formation of the read/write lines RWL0 and RWL1 on the same wiring layer also allows utilization of a capacitance in the XY directions.

The read/write line RWL0 extends in the Y direction and connected to eight sets of chain cells PCC00-PCC03 and PCC20-PCC23. The read/write line RWL1 are connected to eight sets of chain cells PCC10-PCC13 and PCC30-PCC33.

The read/write line RWL0 denotes a wiring that shorts the read/write lines RWL00 and RWL01. Likewise, the read/write line RWL1 denotes a wiring that shorts the read/write lines RWL10 and RWL11. The read/write line RWL00 extends in the Y direction and connected to four sets of chain cells PCC00-PCC03. The read/write line RWL01 also extends in the Y direction and connected to four sets of chain cells PCC20-PCC23. In total, the read/write line RWL0 is connected to eight sets of chain cells. Likewise, the read/write line RWL1 is connected to eight sets of chain cells PCC10-PCC13 and PCC30-PCC33.

The sync lines SL0-SL3 are metal wirings connecting the tops of the sets of chain cells in the X direction as shown in FIGS. 2-4. Each line is connected to the top of the set of four chain cells. That is, the sync line SL0 is connected to the set of chain cells PCC00-PCC30, the sync line SL1 is connected to the set of chain cells PCC01-PCC31, the sync line SL2 is connected to the set of chain cells PCC02-PCC32, and the sync line SL3 is connected to the set of chain cells PCC03-PCC33.

The distal end of the sync line is connected to the power source switch block VSWB as shown in FIG. 2. The power source switch block VSWB connects the sync lines SL0-SL3 to a low voltage power source or a high voltage power source according to Y selection signals Y0-Y3. This embodiment realizes the function by switches SW0-SW3 utilizing inverter circuits. That is, if the Y selection signal input into the inverter circuit has a low potential, the sync line that is the output thereof is shorted to the high voltage power source of the inverter power sources; if the Y selection signal has a high potential, the line is shorted to the low voltage power source. For instance, in an after-mentioned example of an operation in FIG. 6, it is described that the low voltage power source for the sync line is 0 V and the high voltage power source is 5 V. It is thus suffice that power sources equal to these voltages are supplied to the inverter circuit. As well understood, the inverter circuit can be configured by an n-channel MOS transistor and a p-channel MOS transistor.

In a case where the potential difference of the power source supplied to the inverter is larger than the amplitude of the input Y selection signal, a problem in that a leak current flows between the power sources may occur. In such a case, it is a matter of course that a level converter circuit is appropriately inserted between the Y selection signal and the inverter circuit. Instead, various configurations of switches other than the inverter circuit can be considered. However, since engineers of skilled in the art can easily configure a necessary circuit, the simplest example is shown here.

Here, in particular, the wiring SL uses a designation of the sync line instead of a designation, for instance, a bit line or a data line. This is because an after-mentioned bit line BL is connected with a sense circuit, such as a preamplifier MPA, and the sync line is not connected with the sense circuit.

The gate electrodes of the MOS transistors in the chain cells in the subarray are wired on a polysilicon layer $61p$ configuring the gate electrode and connected in the Y direction. That is, the gate electrodes of the chain selection MOS transistors MCS00-MCS03, MCS10-MCS13, MCS20-MCS23 and MCS30-MCS33 are connected. These wirings CSL0-CSL3 are chain cell selection lines. The potential of the line is changed to switch the MOS transistor, to which the line is connected, to the on state or the off state, thereby enabling electric connection between the chain cell and the sync line to be controlled.

The gates of the MOS transistors on the same Z layer in the chain cells are also connected in the Y direction by the polysilicon layers $21p$, $22p$, $23p$ and $24p$. The gate electrodes of the MOS transistors in the memory cells MC00$k$-MC03$k$ are connected by a word line WL0$k$. The gate electrodes of the MOS transistors in the memory cells MC10$k$-MC13$k$ are connected by a word line WL1$k$. The gate electrodes of the MOS transistors in the memory cells MC20$k$-MC23$k$ are connected by a word line WL2$k$. The gate electrodes of the MOS transistors in the memory cells MC30$k$-MC33$k$ are connected by a word line WL3$k$. Here, a subscript k is a number from zero to three, and represents the height in the Z direction in the chain cells.

It can be switched whether the current path of the memory cell can be switched to the MOS transistor or the variable resistance element, by changing the potential of the word line to set the connected MOS transistor to the on state or the off state. In FIG. 2, in order to prevent the word lines from overlapping with each other in appearance, bus representation of one line and an intersecting oblique line is adopted.

Next, the main part of the subarray driver circuit MCA-DRV will be described with reference to FIG. 2. MOS transistors MPR0 and MPR1 are MOS transistors for precharging the read/write lines RWL0 and RWL1, respectively. Precharge signals φPR0 and φPR1 are input to the respective gate electrodes of the MOS transistors MPR0 and MPR1. One ends of drain-source current paths are respective power source input terminals VPR0 and VPR1. The other ends are connected with the read/write lines RWL0 and RWL1. The MOS transistors MPA0 and MPA1 function as the read preamplifier RPA that amplifies a signal read from the selected cell. The gate electrodes of the MOS transistors MPA0 and MPA1 are connected with the respective read/write lines RW0 and RW1. The drain electrodes of the MOS transistors MPA0 and MPA1 are connected with the respective read bit lines BL0 and BL1. The source electrodes of the MOS transistors MPA0 and MPA1 are shorted and connected to the drain electrode of MOS transistor MRE for read enable switch. The source electrode of the MOS transistor MRE for the read enable switch is grounded; a read enable signal φRE is input to the gate electrode.

In FIG. 2, reference symbols WD00-WD0$k$, WD10-WD1$k$, WD20-WD2$k$ and WD30-WD3$k$ denote word drivers for changing the potentials of the word lines. Reference symbols CSD0-CSD3 denote chain selection line drivers for changing the potentials of chain selection lines. Although the operation will be described later in detail, in this embodiment, writing operations, such as setting and resetting, are performed by discharging a charge precharged in the capacitor formed of the read/write lines to the selected chain cell. Likewise, the reading operation determines the state of the variable resistance element in the selected cell according to whether the chain cell which selected the charge precharged in the capacitor formed of the read/write lines is discharged in a short time or not.

Thus, the present invention pertaining to this embodiment includes: a first selection line (e.g., the read/write line RWL00) provided on the semiconductor substrate; a second selection line (e.g., the sync line SL0) that is provided thereabove and extends in a direction intersecting with the first selection line; a memory cell (e.g., MC000) that is provided therebetween and includes a memory element at least to which a current writes memory information and a selection element connected to the memory element; a capacitor provided above or beneath the memory cell; and a driver circuit (e.g., MCA-DRV) that stores a charge in the capacitor. Here, "above" means a positive sense in the Z direction.

The configuration including the capacitor pertaining to this embodiment allows the memory cell to be provided with a potential precharged from the driver circuit with little effect of voltage drop owing to parasitic resistance. This enables the write voltage and unevenness to be reduced. In reading, the charge precharged in the capacitor is discharged to the selected chain cell. At this time, the speed of change in potential of the electrode of the capacitor is different according to whether the variable resistance element of the selected cell among the chain cells is in a low resistance state or a high resistance state. Detection thereof allows data to be discriminated.

Further, in this embodiment, the capacitor includes the first selection line and a third selection line (e.g., the read/write line RWL10). The point that a memory cell is also provided between the third and second selection lines is as with the first selection line. As shown in FIGS. 2 to 4, the read/write lines RWL0 and RWL1 are formed utilizing wirings immediately beneath the subarray. Accordingly, increase in cost through use of special material and increase in cost owing to increase in chip area can be avoided. Further, a long wiring is not required between the capacitor supplying a charge and the memory cell. This avoids extra parasitic resistance. Accordingly, since setting and resetting can be performed at high speed, setting and resetting operations can be completed without generating excessive Joule heat in the selected cell. This can prevent thermal disturbance to neighboring not-selected cells.

The aforementioned structure of the memory cell is not particularly limited. Any structure can be adopted that includes memory elements to which a current writes memory information such that a charge stored in the capacitor can write. Accordingly, for instance, a so-called 1D1R memory cell, which is a memory cell including the memory element and a diode connected to each other in series between the first and second selection lines, may be adopted. Further, in particular, this embodiment shows a configuration in which a plurality of memory cells are provided between the first and second selection lines, the selection element is a transistor in each memory cell, the source-drain path of the selection element and the memory element are connected to each other in parallel, and the memory elements are connected to each other in series between the memory cells. The memory cell between the second and third selection lines is analogous thereto. This configuration pertaining to this embodiment enables k memory cells to be stacked between the selection lines. Thus, this configuration enables an effective cell area per bit to be reduced and allows the bit cost to be reduced.

The read/write lines RWL0 and RWL1 corresponding to electrodes of the capacitor are connected to the gate electrodes of the MOS transistors MPA0 and MPA1 configuring preamplifiers, respectively. The source-drain paths of the MOS transistors MPA0 and MPA1 are connected to the bit lines BL0 and BL1, respectively. Accordingly, for instance, in a case of selecting the chain cells PCC00, if the variable resistance element of the selected cell among the chain cells PCC00 has a low resistance, the potential of the read/write line RWL0 connected to the chain cell and the gate electrode of the MOS transistor MOS-PA0 in the preamplifier is rapidly dropped from the precharge potential to the low potential.

In contrast, the variable resistance element of the selected cell among the chain cells PCC00 has a high resistance, the potential of the read/write line connected to the chain cell and the gate electrode of the MOS transistor of the preamplifier remains at the precharge potential and does not immediately drop. Accordingly, in this state, if the read enable signal RE0 transitions from the low potential to the high potential, only in a case where the variable resistance element of the selected cell has the low resistance, a current flows from the read bit line BL0 to the ground electrode via the MOS transistor configuring the preamplifier. That is, after the read enable signal transitions to the high potential, the main amplifier in FIG. 1 detects the current flowing in the read bit line, thereby allowing detecting magnitude of resistance of the variable resistance element in the selected cell, that is, detecting stored data.

In the above description, the main capacitor driven by the chain cell is only the capacitor formed by the read/write line and capacitance of the gate of the MOS transistor. There is no need to directly drive the read bit line having a large capacitance due to the long wiring length. Accordingly, the current flowing in the chain cell in the reading operation can be reduced.

As described above, it is required not to change the state of the variable resistance element by reducing the current flowing in the chain cell in reading. Accordingly, this embodiment allows the reliable reading operation. Further, the read bit line is driven by the MOS transistor of the preamplifier instead of the chain cell with a small current. Accordingly, a high speed reading operation can be realized.

A summary of the above description is as follows. The variable resistance memory of the present invention once precharges the electrode of the capacitor arranged immediately adjacent to the memory cell array to a potential suitable for the resetting, setting or reading operation, passes a current from the capacitor to the selected memory cell, and performs the setting, resetting or reading operation. This configuration negates the need of a long wiring between the capacitor supplying a charge and the memory cell. This avoids extra parasitic resistance.

Accordingly, the setting and resetting operations can be performed at high speed. This allows the setting and resetting operations to be completed without generating excessive Joule heat in the selected cell. Thus, thermal disturbance to neighboring not-selected cells can be prevented.

The capacitor for precharging is arranged immediately adjacent to the subarray. The precharged voltage can be supplied to the memory cell with little effect of voltage drop owing to the parasitic resistance. This enables write voltage and unevenness to be reduced. Further, in reading, the bit line is not directly driven by the memory cell but is driven by the read MOS transistor connected to the electrode of the capacitor instead. This also allows the reading speed to be improved.

The description of the operation will be described later in detail using an embodiment of timing charts.

FIG. 5 shows an embodiment of the structures of the chain cells suitable for the embodiments in FIGS. 2 to 4. FIG. 5 shows a plan view of one gate polysilicon layer and a sectional view thereof and an equivalent circuit diagram corresponding to a part of the memory cell array, which are arranged together. The equivalent circuit is as described above. As shown in the plan view, a phase-change material and a polysilicon MOS transistor connected thereto in parallel are formed in an individual cell. In the circular section, the gate electrode of the MOS is formed in a toroidal shape at the outermost part of the hole. A gate insulation film 9 is at an inner part thereof. A polysilicon channel 8p is at a further inner part thereof. The core is a phase-change material 7. Although not shown in the diagram, it is a matter of course that an appropriate interlayer film may be formed between the polysilicon channel and the phase-change material as necessary. In the sectional view, reference numeral 2 denotes a metal wiring layer to be the read/write line RWL0; reference numeral PD denotes a polysilicon diode; reference symbol 4p denotes a p-type silicon layer of the polysilicon diode PD; reference symbol 5p denotes a non-doped silicon layer of the polysilicon diode PD; reference symbol 6p denotes a n-type silicon layer of the polysilicon diode PD; reference numeral 32 denotes an insulation material filled between neighboring polysilicon diodes PD. Reference numerals 11, 12, 13, 14, 15 and 71 denote interlayer insulation films; reference symbols 21p, 22p, 23p and 24p denote polysilicon layers to be the word lines WL00, WL01, WL02 and WL03; reference numeral 61p denotes a polysilicon layer to be a chain selection line CSL00. Further, reference numeral 3 denotes a metal wiring layer to be the bit line BL0; reference numeral 38p denotes an n-type polysilicon region for suppress contact resistance between the polysilicon channel 8p and the metal wiring layer 3. The gate electrode is linked in the Y direction and thus forms a word line.

FIG. 6 shows an embodiment of timing charts illustrating an operation of an array driver circuit in reading. FIG. 7 shows an embodiment of timing charts illustrating operations of an array driver circuit in setting and resetting. First, referring to FIG. 6, the reading operation will be described. This diagram shows a case of selecting the memory cell MC003 among the chain cells PCC00 in the embodiments in FIGS. 2 to 4 and reading the information. The diagram shows, from the top, potentials of the precharge power source terminals VPR0 and VPR1, the precharge signals φPR0 and φPR1, the read/write lines RWL0 and RWL1, the sync lines SL0-SL3, the read enable signal φRE, the chain selection lines CSL0-CSL3, the word lines WL0k-WL3k, the read bit lines BL0 and BL1. The abscissa represents time, and the ordinate represents the potentials of the signals and terminals First, the read/write lines RWL0 and RWL1 are precharged to 2 V and 0 V, respectively. That is, in a precharge duration tPR, a following operation is performed. The precharge power source terminals VPR0 and VPR1 are maintained at 2 V and 0 V, respectively. The precharge signals φPR0 and φPR1 are maintained at 7 V. As a result, the read/write lines RWL0 and RWL1 are precharged to 2 V and 0 V. Thus, the precharge signal φPR0 is returned to 0 V and the precharge signal φPR1 is maintained at 7 V. In the duration, among the sync lines, only the sync line SL0 is at 0 V and the sync lines SL1-SL3 are maintained at 5 V. The read enable signal φRE and the chain selection lines CSL0-CSL3 are maintained at 0 V. Among the word lines, only the word line WL03 is set to 7 V and the remaining word lines are maintained at 0 V. The read bit lines BL0 and BL1 are precharged to 2 V.

Subsequently, in the read duration tREAD, a following operation is performed. The precharge power source terminals VPR0 and VPR1 are maintained at 2 V and 0 V, respectively. The precharge signals φPR0 and φPR1 are maintained at 0 V and 7 V, respectively. The read enable signal φRE and the chain selection line CSL0 are set to 7 V. The other chain selection lines CSL1-CSL3 are maintained at 0 V. All the word lines remain in the previous states. That is, only the word line WL03 is maintained at 0 V and the other word lines are maintained at 7 V. As a result, if the phase-change material of the memory cell MC003 has the high resistance, only the X read bit line BL0 decreased to 0 V (broken line) but the X read bit line BL1 remains at 2 V. If the phase-change material of the memory cell MC003 has the low resistance, both the X read bit lines BL0 and BL1 remain at 2 V. The sync line SL0 linked to the selected cell is at 0 V, and the other sync lines SL1-SL3 remain equal to the high voltage of 5 V. Accordingly, even when the potential of the read/write line RWL0 decreases as a result of reading, the diodes of the chain cell to which the selected cell belongs and the chain cell sharing the gate electrode of the chain selection MOS are reversely biased and thereby no current flows between the sync line and the read/write line.

In the above description, the precharge signal of the read/write line RWL1, which is not connected to the selected memory cell, thus remains at the high voltage. This is because of preventing recoupling when the potential of the line RWL0 is changed.

In the embodiment, only the voltage of 2 V is applied to the phase-change material selected in reading at the maximum. This allows reading without phase change, and enables a highly reliable semiconductor memory device to be realized.

The embodiment in FIG. 7 allows high speed reading. Selective operations, such as that reading is performed immediately before setting or resetting to check the state of the selected cell and, if already in the set state, set is not performed, and, if already in the reset state, resetting is not performed, can also be performed at high speed. Since such an operation substantially reduces the numbers of setting and resetting, the life of the semiconductor memory device can be elongated.

Further, it is also possible that an external host or a circuit on the chip periodically checks the state of the cell, verifies whether the resistance value decreases even in the reset state and this causes a malfunction if left as it is or not from an output value from the main amplifier, and a cell with a large fatigue is selected and refreshed. In this embodiment, the high speed operation can be expected. Accordingly, even with these procedures, there is little fear that a large penalty is imposed on normal access of the external host.

Next, referred to FIG. 7, an embodiment of a timing chart of the setting and resetting operations will be described. First, the read/write line RWL0 is precharged to 4 V for setting or to 5 V for resetting. The read/write line RWL1 is precharged to 0 V. In this embodiment, the difference between setting and resetting is in that the precharge voltages of the read/write line linked to the selected cell are 4 V for setting and 5 V for resetting. In the precharge duration tPR, a following operation is performed. The precharge power source terminal VPR0 is maintained at 4 V for setting or 5 V for resetting. The precharge power source terminal VPR1 is maintained at 0 V. The precharge signals ϕPR0 and ϕPR1 are maintained at 7 V. As a result, the read/write line RWL0 is precharged to 4 V for setting or to 5 V for resetting. The read/write line RWL1 is precharged to 0 V. The precharge signal ϕPR0 is returned to 0 V. The precharge signal ϕPR1 is maintained at 7 V. The sync lines SL0-SL3 and the chain selection lines CSL0-CSL3 are maintained at 0 V. Only the word line WL03 is maintained at 0 V and the remaining word lines are maintained at 7 V.

Subsequently, in the write duration tWRITE, a following operation is performed. The potentials of the precharge power source terminal and the precharge signal are maintained as they are. The chain selection line CSL0 is set to 7 V. The other chain selection lines CSL1-CSL3 are maintained at 0 V. All the word lines remain in the previous states. That is, only the word line WL03 is maintained at 7 V and the other word lines are maintained at 0 V. As a result, a voltage is applied from the read/write line RWL0 to the phase-change material in the memory cell MC003 among the chain cells PCC00, and a current flows. This causes phase change in the phase-change material of the selected memory cell, and the material becomes the set or reset state. The sync line SL0 linked to the selected cell is maintained at 0 V. The other sync lines SL1-SL3 are maintained equal to the high voltage of 5 V. Accordingly, even when the potential of the read/write line RWL0 decreases as a result of setting or resetting, the diodes in the chain cell sharing the gate electrode of the chain selection MOS transistor with the chain cell to which the selected cell belongs are reversely biased and thereby no current flows between the sync line and the read/write line.

This embodiment thus allows setting and resetting without causing thermal disturbance to neighboring cells even when high speed set and reset in a subarray scaled to be finer and highly integrated. In the embodiment, in reading in FIG. 6 and setting and resetting in FIG. 7, the precharge voltages are 2 V, 4 V and 5 V, respectively. It is a matter of course that, since the optimal value varies according to the composition, shape and dimensions of the phase-change material, the optimal value suited for situations is adopted. In particular, since setting causes the crystalline state, and resetting causes the amorphous state, a cooling time after a current flows and the temperature becomes high may preferably be relatively longer in setting and relatively shorter in resetting.

For instance, in the above description, the precharge MOS of the read/write line connected to the selected cell is turned off after precharging. In setting, the precharge signal is completely set to 0 V, and the precharge MOS transistor is not completely turned off, for instance, set to above 0 V not to cut off the current abruptly, thereby enabling the cooling time to be adjusted within an extent not to cause thermal disturbance to neighboring cells. This allows more stable operation to be realized.

The embodiments in FIGS. 2 to 4 show the example in which the metal wiring below the subarray including four rows and four columns of chain cells forms the interdigitated capacitance configured by the read/write lines RWL0 and RWL1. As described above, the present invention is applicable to a subarray in which a more number of chain cells are arranged. In this case, the value of the interdigitated capacitance increases as the scale of the subarray increases. On the other hand, in a case where scaling is improved, the cells become fine and the separation between neighboring cells is reduced, the possibility arises that it is preferable to significantly reduce the value of capacitance of the read/write line to prevent an excessive current from flowing in setting and resetting. Even a simple interdigitated capacitance can easily form a capacitance of the order of 100 femtofarads. However, it is useful that a simple change of the layout can change the value of capacitance.

Figure 8A:
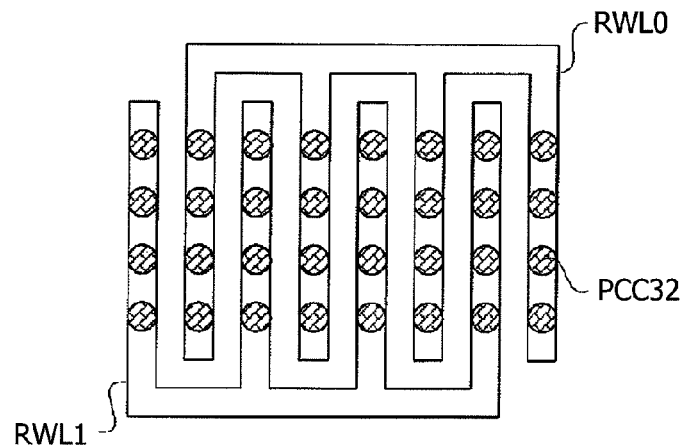
FIGS. 8(A), 8(B) and 8(C) show embodiments of layouts for appropriately adjusting the capacitance of the read/write line.
Figure 8B:
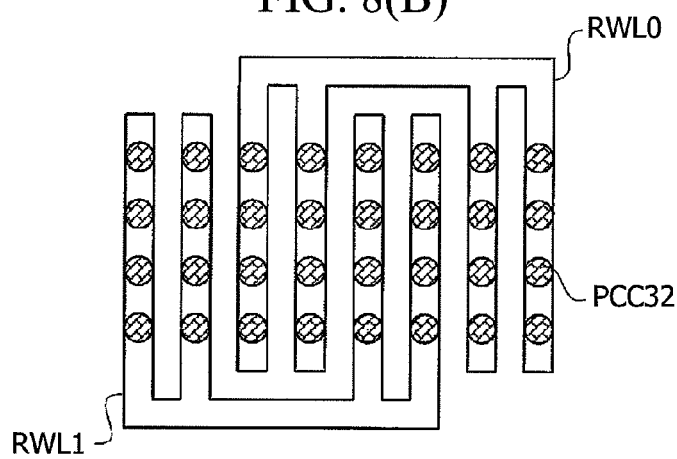
Figure 8C:
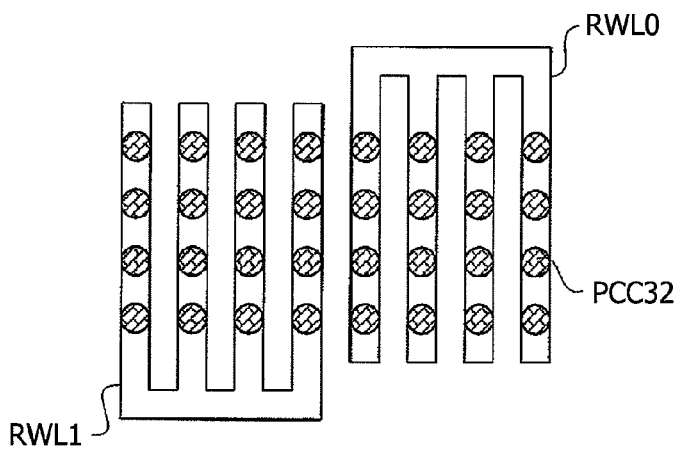

FIGS. 8(A), 8(B) and 8(C) show embodiments suitable for such a case. This diagram shows a situation of viewing the subarrays in the XY directions. The diagram simply shows only the chain cells PCCij (circles) configuring the subarrays and the read/write lines RWL0 and RWL1. The diagram is prepared adopting the subarrays of four rows and eight columns of the chain cells. It can easily be understood that application of this principle to a large scale subarray allows much more variations.

FIG. 8(A) shows a case of forming the read/write lines RWL0 and RWL1 using alternate wirings at intervals of one line. In this case, the line RWL0 connects first, third, fifth and seventh wirings, and the line RWL1 connects second, fourth, sixth and eighth wirings. Accordingly, provided that a pair of opposite wirings has a capacitance $C_0$, the capacitance between the lines RWL0 and RWL1 is approximately $7C_0$.

On the other hand, in FIG. 8(B), the line RWL0 connects first, second, fifth and sixth wirings, and the line RWL1 connects third, fourth, seventh and eighth wirings. In this case, the capacitance between the lines RWL0 and RWL1 is approximately $3C_0$.

In FIG. 8(C), the line RWL0 connects first, second, third and fourth wirings, and the line RWL1 connects the fifth, sixth, seventh and eighth wirings. In this case, the columns where the lines RWL0 and RWL1 are opposed to each other are only the fourth and fifth columns. Accordingly, the capacitance is approximately $C_0$.

In this embodiment, only change of the layout of the read/write lines enables the value of capacitance to be adjusted without adding another wiring layer and using a special material. This allows a capacitance required for setting and resetting to be formed without increase in cost. It is a matter of course that adjustment of the thickness of the wiring layer allows the value of capacitance to be changed to a certain extent.

Here, the case where only one pair of read/write lines is formed for each subarray has been described. However, various modifications can be made, such as formation of a plural pairs of the read/write lines according to the charges required for setting and resetting, the capacitance capable of being formed by the read/write lines, and the number of the chain cells selected for each subarray. Further, if a certain cost is allowable, the capacitance of the read/write line may be formed using two layered wirings, an insulator thinner than an interlayer film of a typical wiring may be used, and capacitors in various shapes may be formed immediately adjacent to the subarray. In this case, it becomes easier to improve the value of capacitance per area. Even in a case of using the wiring layer, the capacitor of the read/write lines between the subarrays can be formed by adjacently forming metal that passes through the interlayer film in the Z direction for connecting upper and lower wirings and referred to as a so-called contact, or a via, instead of a planar wiring. If capacitor can be formed between the subarrays without penalty in area, an advantage capable of reducing an effect of noise from or to the subarray may be achieved in comparison with the case of formation immediately beneath or above the subarray.

In the embodiments having been described, as shown in FIGS. 2 to 4, the chain cells are arranged in an array, the polysilicon gate electrode of the chain selection MOS transistor MCsij at the top of the chain is connected in the Y direction, and the polysilicon gate electrode of the memory cell MCijk is separated in the X and Z direction and connected in the Y direction. According to such a layout, the minimum pitch between the chain cells in the XY plane can be reduced to 2 F in the Y direction, but the pitch can be reduced only to 3 F in the X direction. Here, F is the minimum processing dimension of a semiconductor process.

Figure 9:
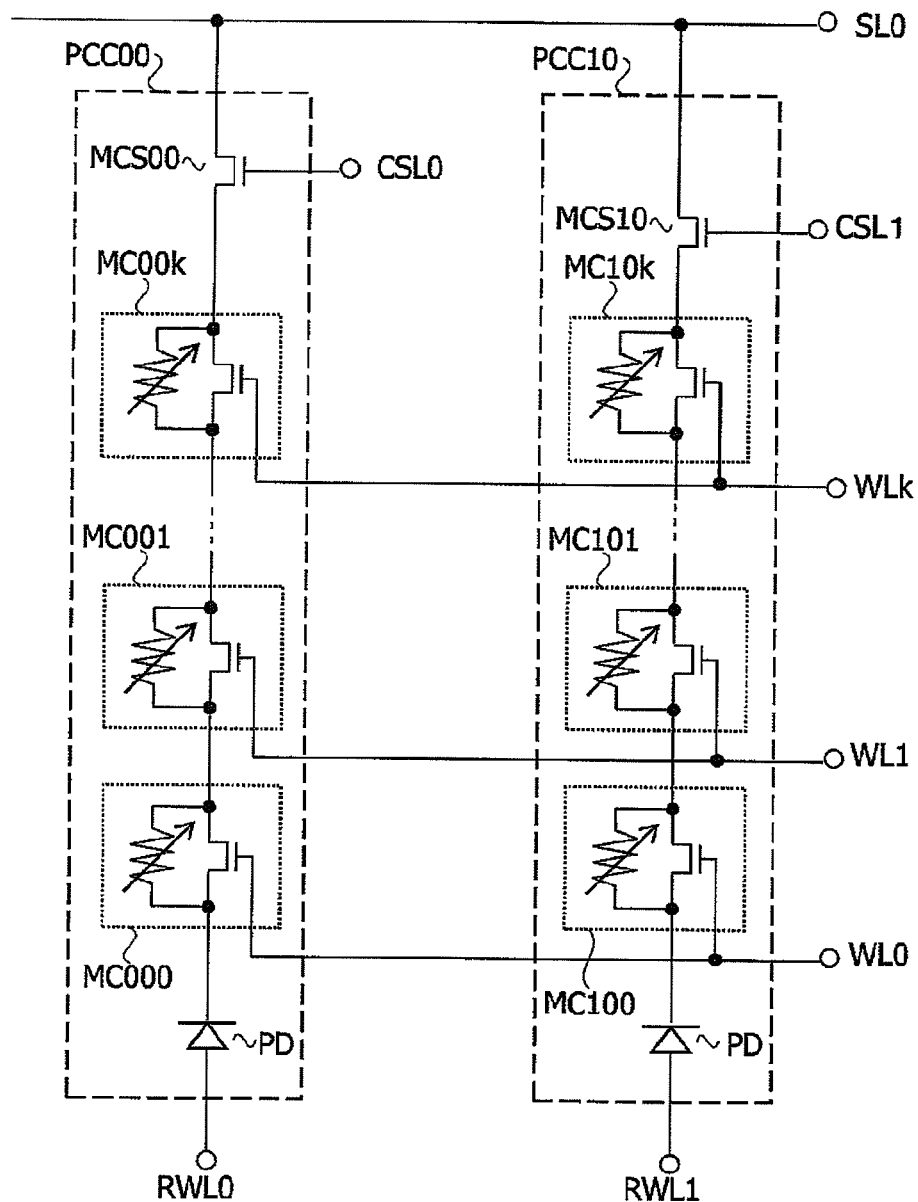
FIG. 9 is a diagram showing a configuration of subarrays and subarray driver circuits viewed in the YZ plane in an embodiment where the planar density of the chain cells is 4 $F^2$.
Figure 10:
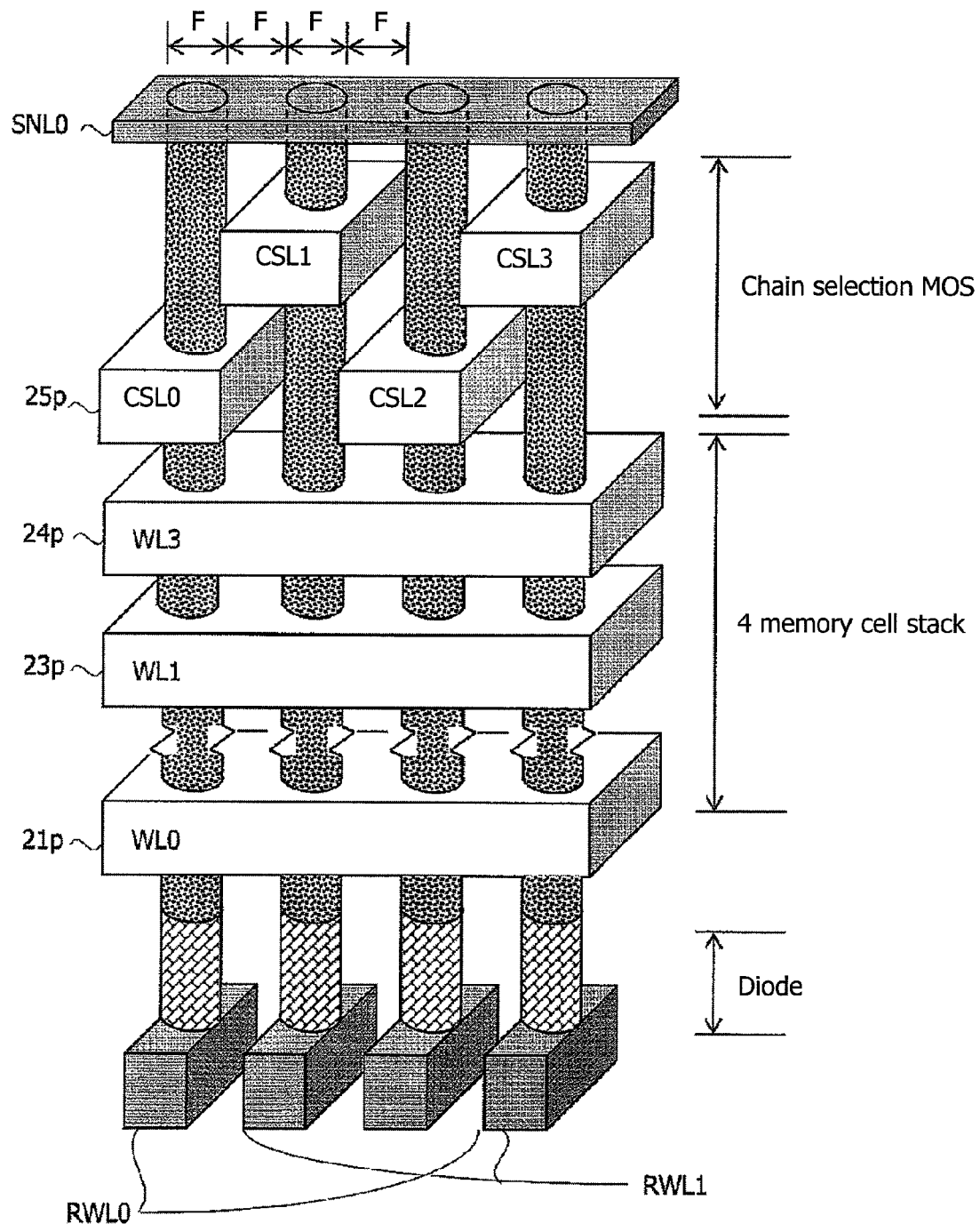
FIG. 10 is a diagram showing the embodiment in FIG. 9 as a perspective view.

Next, referring to FIGS. 9 to 11, embodiments of the present invention capable of allowing the pitch of the chain cells to be 2 F in both the X and Y directions will be described. FIG. 9 is a diagram showing configurations of subarrays and subarray driver circuits viewed in the YZ plane in this embodiment. FIG. 10 is a diagram showing the embodiment in FIG. 9 as a perspective view. FIGS. 9 and 10 correspond to respective FIGS. 3 and 4 in the above embodiments.

Figure 11A:
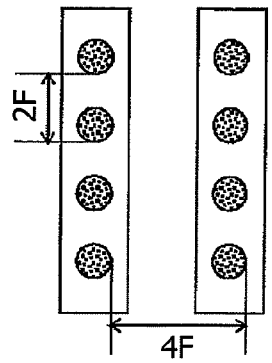
FIGS. 11(A), 11(B) and 11(C) are diagrams showing a layout of a polysilicon gate in the embodiment in FIG. 9.
Figure 11B:
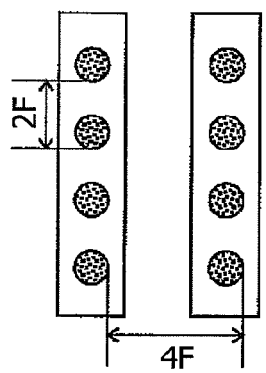
Figure 11C:
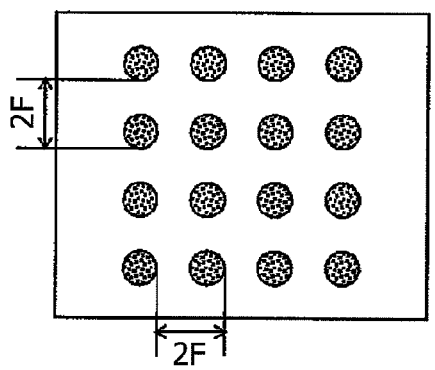

FIGS. 11(A) to 11(C) are diagrams showing layouts of polysilicon gates in the embodiment in FIG. 9. In FIG. 11, the number of the sets of chain cells in a subarray is four in the X direction and four in the Y direction. However, as described above, the present invention is not limited to the scale of the subarray. Instead, the embodiment in FIG. 11 is also applicable to subarrays of various scales.

The difference between this embodiment and the aforementioned embodiment is the difference in the polysilicon gate structure of the MOS transistor in the chain cell. In the aforementioned embodiment, the gate electrodes of the MOS transistors in the cells are connected in the Y direction but separated in the X and Y directions. In contrast, as apparent in FIGS. 9, 10 and 11(C), in this embodiment, the polysilicon gates of the MOS transistors in the memory cells are separated only in the Z direction, and are common electrodes in the XY plane. As shown in FIG. 11(C), the gates has a structure where holes at chain parts are passes through one polysilicon gate. The pitch of the holes is 2 F in both the X and Y directions. In one set of chain cells, the MOS transistors in the memory cells and the chain selection MOS transistor are connected in series. Accordingly, in a case where the chain selection MOS can be provided with a function of selecting only one column in the Y direction, even if the gate electrodes at the cell parts are not separated in the XY directions, an operation logically identical to that of the aforementioned embodiment can be performed.

As described above, in the structure in FIG. 11(C), the minimum space of the hole in the chain can be 2 F in both the X and Y directions. However, the problem is that the chain selection MOS is required to be separated in the X direction as described above. If this is realized in one layer of polysilicon gates, the minimum space in the X direction cannot be 2 F. IEEE International Electron Devices Meeting, 2007, pp. 449-452, "Optimal Integration and Characteristics of Vertical Array Devices for Ultra-High Density, Bit-Cost Scalable Flash Memory" discloses a method of narrowing the pitch by separating the selection transistors into two layers, as to a multilayered flash memory.

The present invention also allows the pitch to be reduced by separating the chain selection MOS transistors into different two layers in the Z direction. In the embodiment shown in FIG. 9, the chain selection MOS transistor is configured in different two layers in the Z direction. FIGS. 11(A) and 11(B) show each layout of the XY plane of the polysilicon gate electrode of the chain selection MOS transistor separated into two layers. Both the electrodes have striped shapes extending in the Y direction. In the Y direction, holes for chain cells pass in the Y direction at a pitch of 2 F. The pitch in the X direction is 4 F. Both the electrodes deviate by 2 F in the X direction. Accordingly, in consideration of the two layers altogether, in the XY plane, the chain selection MOS transistors are arranged at a pitch of 2 F in both the X and Y directions. As a result, the number of polysilicon layers increases by one in comparison with the aforementioned embodiment. The area of the XY plane of the chain cells is reduced to two thirds, from 6 $F^2$ to 4 $F^2$. Accordingly, it is expected that the number of chips to be taken from a wafer is increased exceeding increase in manufacturing cost.

In the embodiments described in FIGS. 9 to 11, the polysilicon gate layer at the cell part has a plate-like shape that is not separated in the XY directions. This shape can be made by only forming holes for chain cells after forming layers. Thus, there is an advantage that the manufacturing process is simple.

However, as described above, the gate of the chain selection MOS transistor is required to be subjected to a lithography process of separation into two layers, separating in the X direction. Accordingly, in some cases, such a process of manufacturing the chain selection MOS may be omitted, thereby allowing a further advantage in cost.

Figure 12:
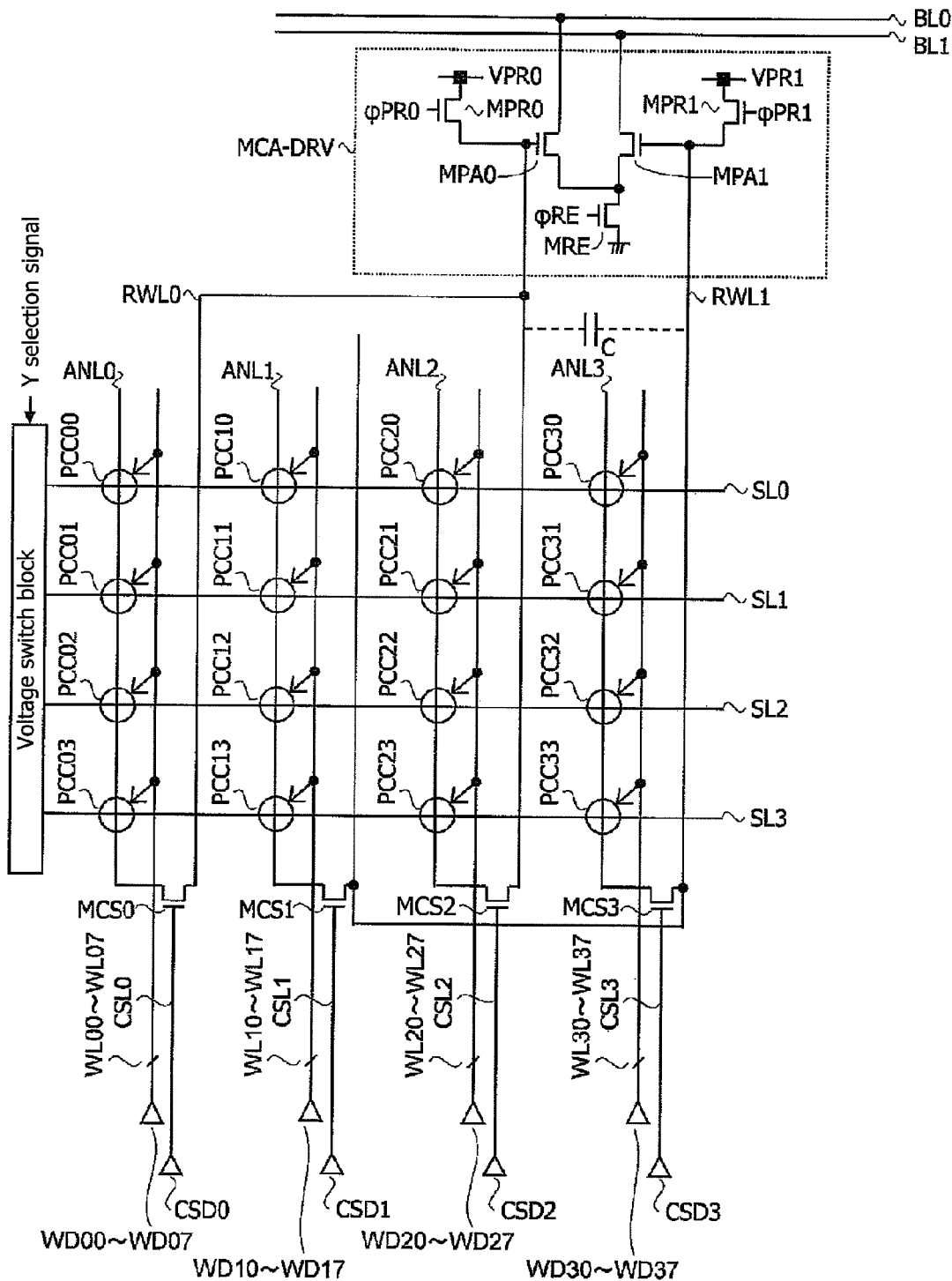
FIG. 12 is a diagram showing a configuration of subarrays and subarray driver circuits viewed in the XY plane in a second embodiment where the planar density of the chain cells is 4 $F^2$.

FIG. 12 shows an embodiment suitable for such a case. FIG. 12 shows a diagram of the XY plane. In this embodiment, the planar area of the chain cells is 4 $F^2$ which is identical to that of the above embodiment. The polysilicon gate at the cell part has a plate-like shape. The difference is in that the chain selection MOS transistor at the top of the part of the chain cells is configured by the grounding MOS transistor and omitted from the part of the chain cell. In FIG. 12, the chain cell is represented as a circle viewed from the XY directions. Accordingly, it should be noted that in this diagram this point is not clear.

The anodes of diodes are connected to wirings ANL0 to ANL3 in the Y direction. Further, grounding MOS transistors MCS0-MCS3 having a chain selection function are newly arranged in the X direction beneath the subarray. The gate electrodes thereof are used as chain selection lines CSL0-CSL3. The wirings ANL0-ANL3 connected to the anodes in the Y direction are connected to the drains of the respective grounding transistors MCS0-MSC3.

On the other hand, source electrodes are alternately connected to the read/write lines RWL0 and RWL1. This can become equivalent in circuit to the cases in FIGS. 9 to 11.

This embodiment allows the area of the XY plane of the chain cells to be 4 $F^2$ and further negates the need of a lithography process on the polysilicon layer of the chain cell. Accordingly, further reduction in cost can be expected. In the case where grounding transistors as many as the number of sets of chain cells in the X direction are arranged as described above, layout in a line can be sometimes difficult. In such a case, the grounding MOS transistor connected to odd-numbered sets of chain cells counting from the end of the subarray in the X direction and the grounding transistor connected to even-numbered sets of chain cells are arranged in a manner separated into two side of the subarray, thereby allowing the pitch at which the grounding transistors are arranged is relaxed. In a case where layout is still difficult, layout is appropriately made in a manner separated into a plurality of lines in the Y direction.

Next, an embodiment in which the present invention is applied to chain cells having planar areas further smaller than the above case will be described.

Figure 13:
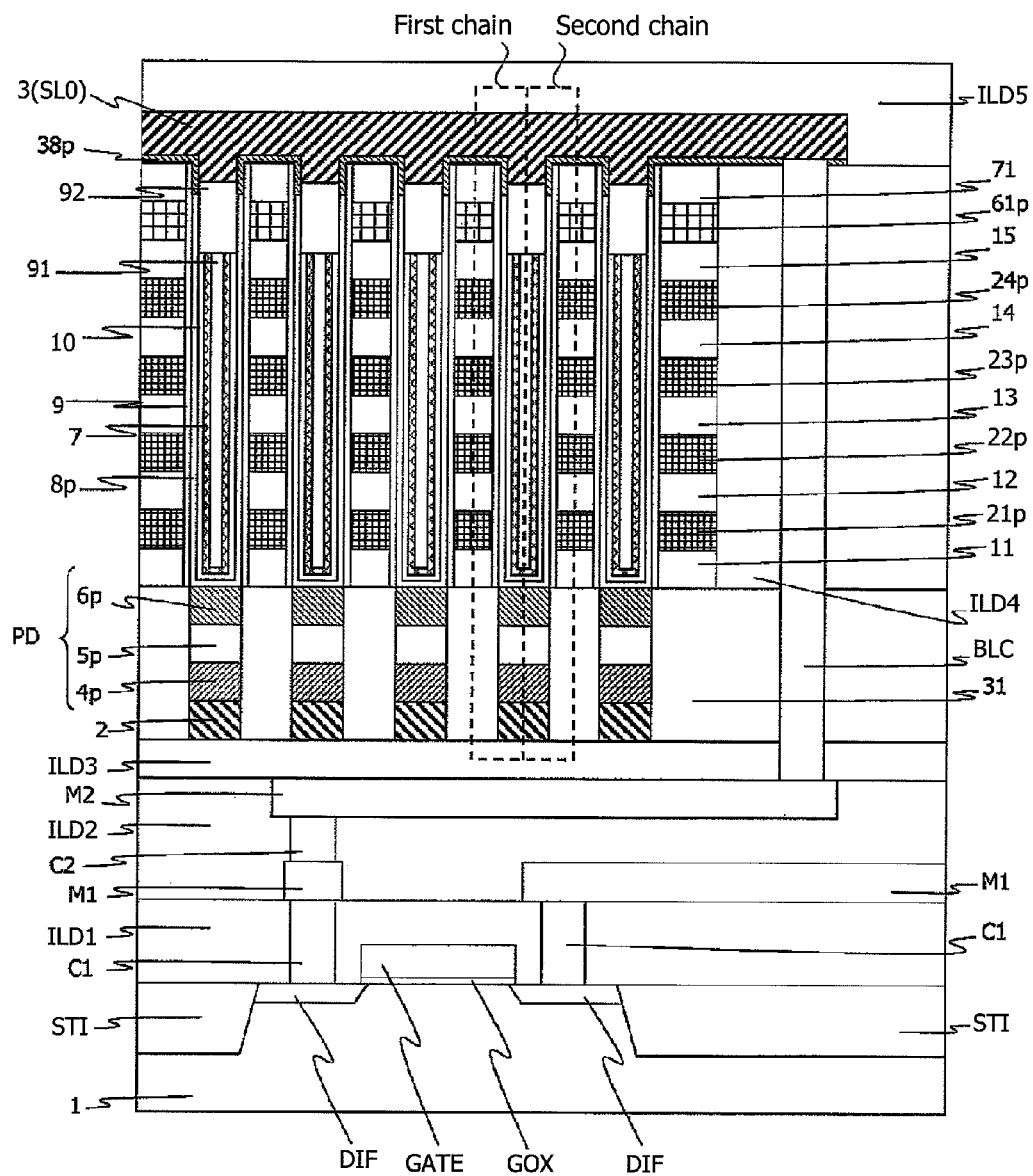
FIG. 13 shows an embodiment where the planar density of the chain cells is 2 $F^2$.

FIG. 13 shows an embodiment allowing the planar density of the chain cells to be 2 $F^2$. In the embodiments described above, one set of chain cells is formed in each hole passing in the Z direction through the plurality of gate polysilicon layers. On the other hand, this embodiment is characterized in that two sets of chain cells (a first chain and a second chain) are formed therein. At a part of a memory cell there are, in the X direction, gate polysilicon layers (21p, 22p, 23p and 24p) of the MOS transistors, an insulation film (9), a channel (8p), a phase-change material (10), which configure the first chain; further, via the insulation film (91), a phase-change material, a channel of MOS transistor, an insulation film, a polysilicon gate, which configure the second chain, are formed. In this embodiment, the chain cells twice as much as those of the above embodiment are formed in the X direction. Another characteristic of the chain cells in this diagram is that the chain cells are stacked on the MOS transistor formed on the semiconductor substrate 1. In particular, this transistor is used for connecting the metal wiring layer 3 as a source line and a power source terminal, which is not shown in this diagram, to each other. As to the MOS transistor, this diagram shows an element separation groove STI, the gate GATE of the transistor, a gate insulation film GOX, a diffusion layer DIF. As a structure for connecting the transistor and the metal wiring layer 3 as a bit line to each other, FIG. 13 shows a part configured by interlayer insulation films ILD1, ILD2, ILD3, ILD4 and ILD5, wiring layers M1 and M2, a contact hole C1 connecting a device on a semiconductor substrate and the layer M1 to each other, a contact hole C2 connecting the layers M1 and M2, a contact hole BLC connecting the metal wiring layer 3 as the bit line and the MOS transistor formed on the semiconductor substrate 1 to each other, an interlayer insulation film 31 embedded between polysilicon diodes PD.

Figure 14:
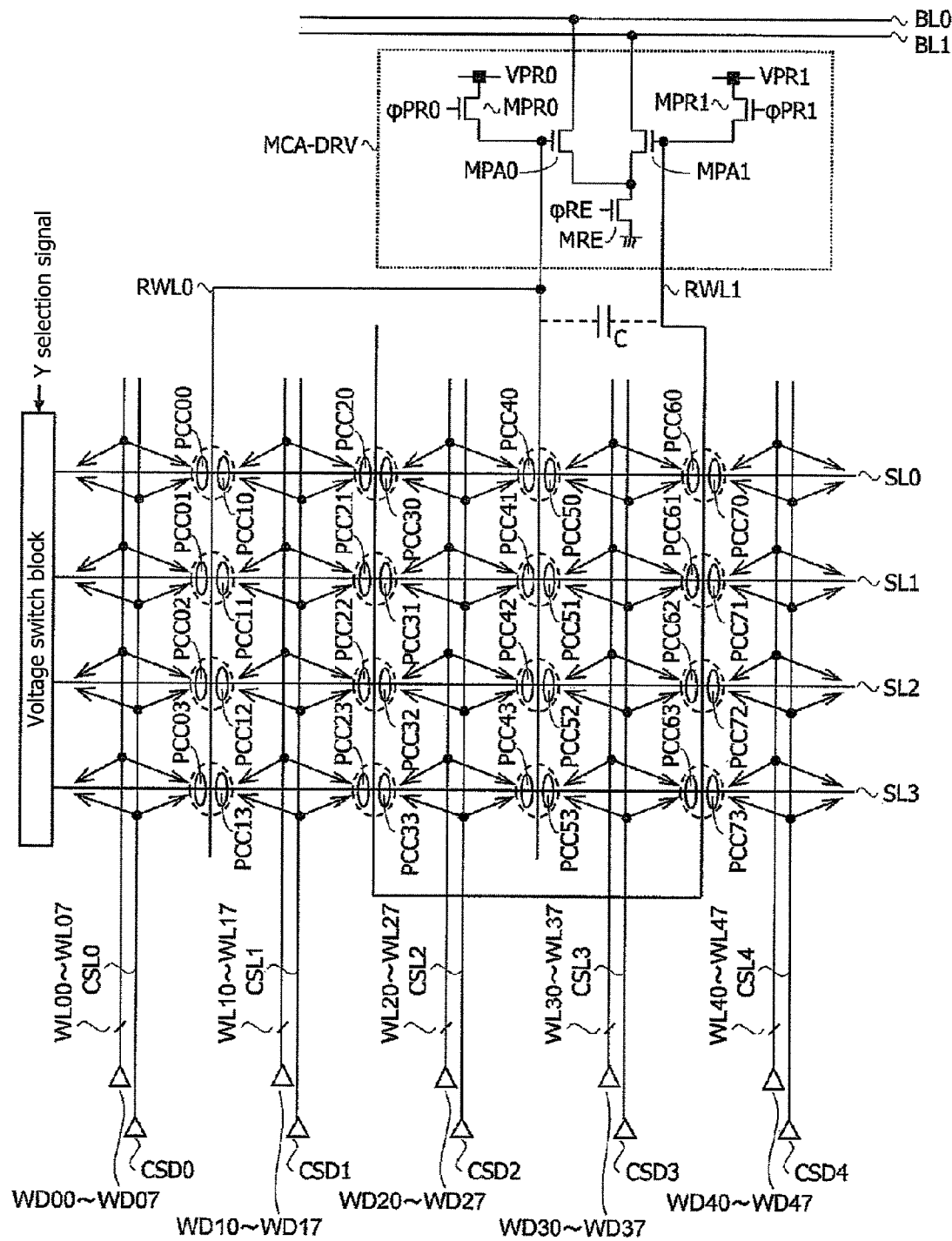
FIG. 14 is a diagram showing the configuration of the subarrays and the subarray driver circuits viewed in the XY plane in the embodiment using the chain cells in FIG. 12.
Figure 15:
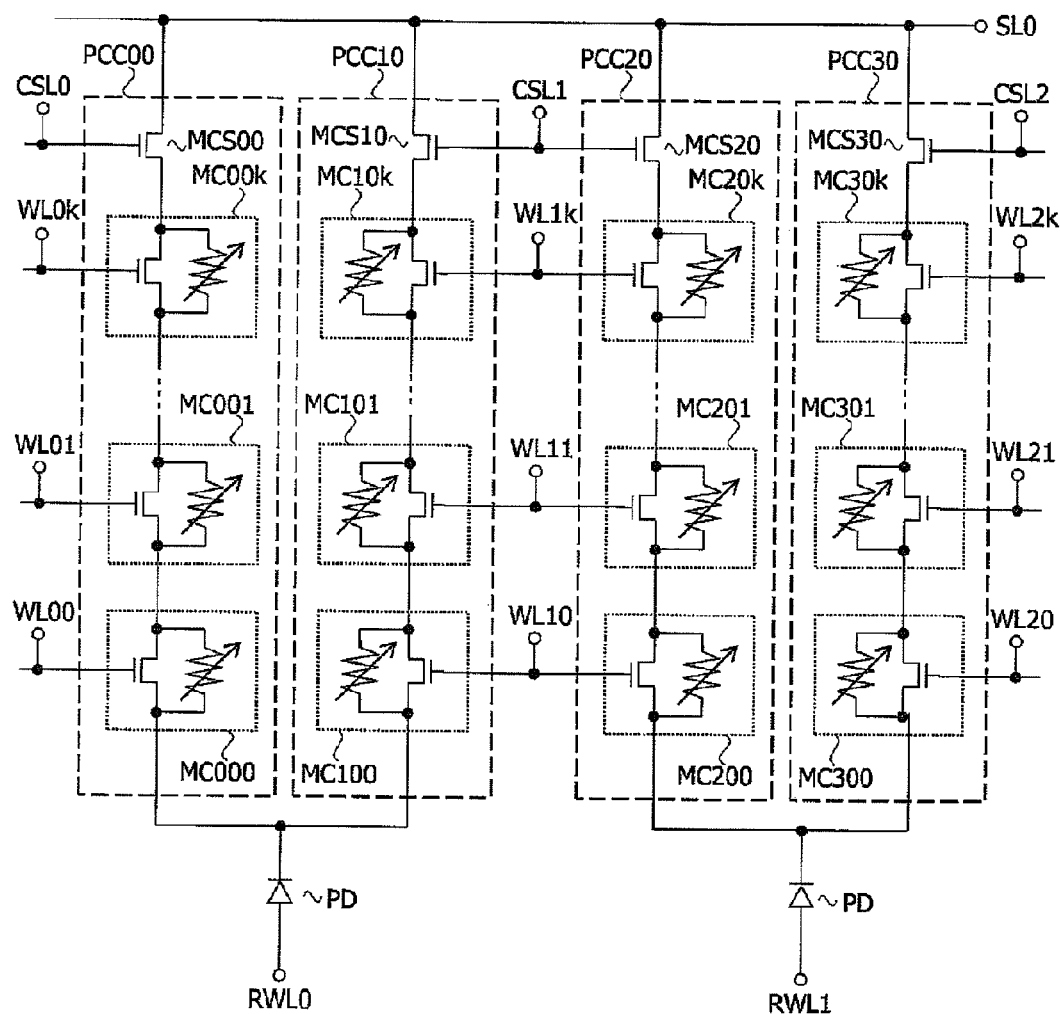
FIG. 15 is a diagram showing the configuration of the subarrays and the subarray driver circuits viewed in the YZ plane in the embodiment using the chain cells in FIG. 12.

FIG. 14 is a diagram showing the configuration of the subarrays and the subarray driver circuits viewed in the XY plane in the embodiment using the chain cells in FIG. 13. FIG. 15 is a diagram showing the configuration of the subarrays and the subarray driver circuits viewed in the YZ plane in the embodiment using the chain cells in the embodiment in FIG. 13. As apparent from comparison between these diagrams and FIGS. 2 and 3, characteristics different from the embodiments in FIGS. 2 and 3 are that, in addition that a two-fold number of chain cells are formed in the X direction, the polysilicon gate of the chain cell formed on the side surface of the adjacent hole is shared. This enables the pitch of the holes of the polysilicon layer in the X direction to be 2 F. The pitch in the Y direction is 2 F. Accordingly, the XY planar density of the hole is 4 $F^2$. Since two sets of chain cells reside in one hole, the planar density of the sets of chain cells is 2 $F^2$, which is highly integrated. The diode is formed at the bottom of one hole (In FIG. 14, parts corresponding to circles in broken lines). Thus, a configuration in which two chains share one diode is adopted. The fundamental operation principle is identical to the principle of the aforementioned embodiment, whether in reading, setting or resetting. First, while the capacitor configured by the read/write lines RWL0 and RWL1 is precharged, the polysilicon gate of the selected cell is set to the low potential and the gate of the not-selected cell is set to the high potential. Next, the polysilicon gate electrode of the chain selection MOS transistor to which the selected cell belongs is set to the high voltage such that the precharged voltage is applied to the phase-change material of the selected cell, and then reading, setting or resetting is performed.

The difference from the aforementioned embodiment is that the diode prevents a current from flowing through the non-selected chain cell. This will herein be described. Although the voltages are different according to reading, setting and resetting, the relationship of height of potential on the identical line is the same. Here, the high potential is represented as High and the low potential is represented as Low, and the description is made. It is provided that the MOS transistor to be used is an n-channel MOS transistor and the gate voltage is turned on at High and off at Low. In any of reading, setting and resetting, the description is made in which only one cell is selected from the subarray in any of reading, setting and resetting. The gate of the chain selection MOS transistor including the cell to be selected is set to High and the others are set to Low. The selected sync line and the selected word line are set to Low, the non-selected lines among them are set to High. The selected read/write line is set to High, and the non-selected line is set to Low.

As a result thereof, the anode of the diode at the bottom of the selected chain cells is High, the gate (word line WL) of the selected cell is Low, the gate of the chain selection MOS is High, and the sync line SNL is Low. Accordingly, a current flows from the anode to the sync line SNL, and thus the current flows to the phase-change material only in the selected cell.

On the other hand, at the chain cells that share the gate of the chain selection MOS transistor with the selected chain cells, that is, have the same X coordinate, the anode is High, but the sync line SL is non-selected and High. Accordingly, no current flows. At the chain that shares the word line WL with the selected chain cells, the read/write line RWL is Low. Accordingly, there is no potential difference with the selected sync line in Low. However, the non-selected sync line is High, and a potential difference is generated between the read/write line RWL and the sync line SNL.

However, since the diode is reversely biased, no current flows. At some of the chain rows other than this, the read/write line RWL is High and the sync line SNL is Low, but the chain selection MOS is off. Accordingly, no current flows. In this embodiment the gates of the MOS transistors in the cells in neighboring cells are electrically connected to each other, and the gates of the chain selection MOS transistors are electrically connected to each other.

Accordingly, the chain cells adjacent to the selected chain cells are also electrically connected to the identical sync line via the chain selection MOS transistors. Here, a case can be considered where a part of a current flowing from the selected chain to the sync line flows into the neighboring non-selected chain cells. However, the sync line connected to the selected chain cells is connected to the grounding potential with low impedance, and the current hardly flows to the non-selected chain cells. In the worst case, if the current flows thereto, the potential of the read/write line connected to the anode of the diode at the bottom to the chain is grounded. Accordingly, the current does not continue to flow. Thus, an appropriate circuit design can avoid heating the phase-change material in the cell in the non-selected chain cell and causing degradation.

The embodiments having been described above enables the area of the XY plane of the chain cells to be significantly small, or to 2 $F^2$, thereby allowing a large capacity semiconductor memory device to be realized. Further, the control circuit of the present invention allows reading, setting and resetting the phase-change material at high speed with a small current. Accordingly, even a cell array that has a three-dimensional structure with a small planar area of 2 $F^2$ allows a stable operation having little thermal disturbance and unevenness to be realized. It is a matter of course that the advantage of also allowing verified reading and refresh operations, having been described in the aforementioned embodiment, is common.

As described above, the present invention performs reading, setting and resetting using the capacitor adjacent to the subarray. Setting and resetting can be performed at high speed because little parasitic resistance and capacitance are generated; further, no extra current continues to flow. Accordingly, even in a case where the cells are adjacent to each other in a high density manner, the variable resistance element in the not-selected cell can be prevented from degenerating owing to heat.

Unevenness of the voltage to be supplied and reduction in the voltage owing to the wiring resistance can also be avoided. Accordingly, highly reliable operations can be expected. Further, the capacitor electrode provided at each subarray is connected with the read preamplifier via the gate electrode having a small parasitic capacitance and a high impedance. This also realizes a high speed reading using low voltage and current that do not cause degradation on the selected cell. This high speed reading not only increases the system performance but also allows resetting where the number of rewriting is substantially suppressed by reading before setting or resetting as described above, allows reading after resetting, and further allows high speed verification.

Finally, an example of application of the high speed verification that is an advantage of the present invention will be described. In a case where application voltages suitable for setting and resetting vary among the cells, it is useful that setting or resetting is started from a lower voltage and stopped if a desired resistance value is reached as a result of subsequent verification and, if not reached, the precharge voltage is gradually increased to perform setting again, resetting and continuing verification.

As to some variable resistance elements, there are materials that require several times of setting and resetting operations while the voltage is maintained constant. In this situation, in a case where the number of such operations varies among the cells, it is useful that setting or resetting is started and, according to a result of subsequent verification, stopped if a desired resistance value is reached, but setting, resetting and verification are continued if the value is not reached. In such a case, if setting and resetting are simultaneously performed on a plurality of subarrays, the number of completion of setting and resetting varies among the subarrays.

As measures against this is taken such that a circuit for latching a verification result on the basis of an output from the preamplifier is provided for each subarray driver circuit, and, if a result of verification shows success of setting or resetting, a control is performed of turning off all the chain selection MOS transistors in the next setting and resetting. With such measures, even if reading, setting and resetting are performed on every subarray according to an identical sequence for a predetermined repeating times, setting and resetting operations are automatically stopped in the subarrays where the setting and resetting have succeeded. According thereto, from a standpoint of an external host, a time required for the operation is always constant. Therefore, the operability is better than a case in which durations of the busy state according to respective chips are unpredictable.

In some subarrays, setting or resetting may be unsuccessful even after the predetermined repeating times has completed. The memory cell selected in such a subarray may be failed. Accordingly, latch information can be transmitted to the external host apparatus. In an application to a test immediately after manufacture, the failed cell can be substituted by a redundant cell.

Various modifications can be made to the aforementioned embodiments within the gist of the present invention. For instance, in the embodiments in FIGS. 6 and 7, the precharge voltages of the read/write line of 2 V, 4 V and 5 V are used in reading, setting and resetting, respectively. However, in some cases, preparation of power sources having multiple voltages may be difficult. In such cases, for instance, in setting or resetting, the line is once precharged to 2 V, and then the voltage is raised to a value higher than 2 V in setting or resetting using capacitive coupling with the neighboring read/write line. According thereto, only one type of power source for the read/write line may be adopted.

DESCRIPTION OF SYMBOLS

In following symbols, subscripts, such as i, j and k, represent integers.
CHIP semiconductor chip
IO data input/output circuit
CCTL chip control circuit
PWC power source circuit
RPA read preamplifier
RMA read main amplifier
WDV write data driver
DEC decoder
MCA-DRV subarray driver circuit
MCA00-MCAmn subarray
PCCij chain cell
mcsij, mcsi chain cell selection MOS transistor
sli sync line
CSLi chain cell selection line
Rwli read/write line
Bli read bit line
c capacitance component of read/write line
MCijk memory cell
dij diode
WLik word line
MPRi precharge MOS transistor
φPRi precharge signal
VPRi power source input terminal
MPAi MOS transistor configuring preamplifier
MRE read enable switch MOS transistor
φRE read enable signal
WDij word driver
CSDi chain selection line driver

What is claimed is:

1. A semiconductor memory device, comprising:
a first selection line provided on a semiconductor substrate;
a second selection line that is provided above or beneath the first selection line and extends in a direction intersecting with the first selection line;
a first memory cell that is provided between the first and second selection lines and includes a first memory element to which a current writes memory information and a first selection element connected to the first memory element;
a capacitor provided above or beneath the first memory cell; and
a driver circuit that stores a charge in the capacitor,
wherein the charge writes in the first memory element.

2. The semiconductor memory device according to claim 1, further comprising:
a third selection line that is provided on the semiconductor substrate and extends in a direction parallel with the first selection line; and
a second memory cell that is provided between the second and third selection lines and includes a second memory element to which a current writes memory information and a second selection element connected to the second memory element,
wherein electrodes of the capacitor include the first and third selection lines.

3. The semiconductor memory device according to claim 2,
wherein a plurality of the first memory cells are provided between the first and second selection lines,
in each of the plurality of first memory cells, the first selection element is a transistor, and a source-drain path of the first selection element and the first memory element are connected to each other in parallel,
the first memory elements are connected to each other in series,
a plurality of the second memory cells are provided between the second and third selection lines,
in each of the second memory cells, the second selection element is a transistor, and a source-drain path of the second selection element and the second memory element are connected to each other in parallel, and
the second memory elements are connected to each other in series.

4. The semiconductor memory device according to claim 2, further comprising:
a fourth selection line that is provided on the semiconductor substrate and extends in a direction parallel with the first selection line;
a fifth selection line that is provided on the semiconductor substrate and extends in a direction parallel with the first selection line;
a third memory cell that is provided between the second and fourth selection lines and includes a third memory element to which a current writes memory information and a third selection element connected to the third memory element; and
a fourth memory cell that is provided between the second and fifth selection lines and includes a fourth memory element to which a current writes memory information and a fourth selection element connected to the fourth memory element,
wherein the first and fourth selection lines are shorted to each other, and
the third and fifth selection lines are shorted to each other.

5. The semiconductor memory device according to claim 4,
wherein the third selection line is provided between the first and fourth selection lines, and
the fourth selection line is provided between the third and fifth selection lines.

6. The semiconductor memory device according to claim 4,
wherein the third selection line is provided between the fourth and fifth selection lines.

7. The semiconductor memory device according to claim 2,
wherein the first and third selection lines are formed on the same wiring layer.

8. The semiconductor memory device according to claim 1, further comprising a first bit line and a second bit line,
wherein the driver circuit includes:
a first precharge circuit that supplies the first selection line with a charge;
a second precharge circuit that supplies the third selection line with a charge;
a first amplifier including a first transistor that is connected with the first bit line and a source-drain path thereof and further connected with the first selection line and a gate thereof; and
a second amplifier including a second transistor that is connected with the second bit line and a source-drain path thereof and further connected with the third selection line and a gate thereof.

9. The semiconductor memory device according to claim 1, further comprising:
a first diode that is provided between the first and second selection lines and connected to the first memory element in series; and
a power source switch that connects the second selection line to a first power source or a second power source of a voltage higher than the first power source.

10. The semiconductor memory device according to claim 1,
wherein, immediately before or after writing memory information to any first memory element, the device reads memory information from the first memory element.

* * * * *